(12) United States Patent
Hirakata et al.

(10) Patent No.: US 9,743,071 B2
(45) Date of Patent: Aug. 22, 2017

(54) DISPLAY DEVICE

(71) Applicant: Semiconductor Energy Laboratory Co., Ltd., Atsugi-shi, Kanagawa-ken (JP)

(72) Inventors: Yoshiharu Hirakata, Ebina (JP); Jun Koyama, Sagamihara (JP); Shunpei Yamazaki, Setagaya (JP)

(73) Assignee: Semiconductor Energy Laboratory Co., Ltd., Kangawa-ken (JP)

( * ) Notice: Subject to any disclaimer, the term of this patent is extended or adjusted under 35 U.S.C. 154(b) by 67 days.

(21) Appl. No.: 14/669,533

(22) Filed: Mar. 26, 2015

(65) Prior Publication Data

US 2015/0198813 A1    Jul. 16, 2015

Related U.S. Application Data

(63) Continuation of application No. 13/363,408, filed on Feb. 1, 2012, now Pat. No. 9,167,234.

(30) Foreign Application Priority Data

Feb. 14, 2011   (JP) .................................. 2011-029203
Feb. 16, 2011   (JP) .................................. 2011-030566
Jun. 15, 2011   (JP) .................................. 2011-133336

(51) Int. Cl.
    *G09G 5/10*      (2006.01)
    *H04N 13/04*     (2006.01)
    *G02B 27/22*     (2006.01)
    *G02F 1/133*     (2006.01)
    *G02F 1/1362*    (2006.01)
    (Continued)

(52) U.S. Cl.
    CPC ....... *H04N 13/0409* (2013.01); *G02B 27/225* (2013.01); *G02F 1/1368* (2013.01);
    (Continued)

(58) Field of Classification Search
None
See application file for complete search history.

(56) References Cited

U.S. PATENT DOCUMENTS 5,315,377 A    5/1994   Isono et al.
5,731,856 A    3/1998   Kim et al.
(Continued)

FOREIGN PATENT DOCUMENTS

CN      101938666 A    1/2011
EP        0540137 A     5/1993
(Continued)

OTHER PUBLICATIONS

International Search Report (Application No. PCT/JP2012/053198) Dated Mar. 13, 2012.
(Continued)

*Primary Examiner* — Adam R Giesy
(74) *Attorney, Agent, or Firm* — Robinson Intellectual Property Law Office; Eric J. Robinson

(57) ABSTRACT

A display device capable of displaying both a 3D image and a 2D image is provided. The display device includes a plurality of optical filter regions where light-blocking panels for producing binocular disparity are arranged in matrix. The light-blocking panel can select whether to transmit light emitted from a display panel in each of the plurality of optical filter regions. Thus, in the display device, some regions where binocular disparity is produced can be provided. Consequently, the display device can display both a 3D image and a 2D image.

27 Claims, 18 Drawing Sheets

(51) Int. Cl.
  *G02F 1/1368* (2006.01)
  *G09G 3/00* (2006.01)
  *H01L 27/12* (2006.01)
  *G02F 1/1347* (2006.01)

(52) U.S. Cl.
  CPC .... *G02F 1/13306* (2013.01); *G02F 1/136209* (2013.01); *G09G 3/003* (2013.01); *H01L 27/1225* (2013.01); *H04N 13/0422* (2013.01); *H04N 13/0454* (2013.01); *H04N 13/0456* (2013.01); *G02F 1/1347* (2013.01); *H04N 2213/001* (2013.01)

(56) References Cited

U.S. PATENT DOCUMENTS

| | | |
|---|---|---|
| 5,744,864 A | 4/1998 | Cillessen et al. |
| 5,764,321 A | 6/1998 | Koyama et al. |
| 5,945,965 A | 8/1999 | Inoguchi et al. |
| 5,959,664 A | 9/1999 | Woodgate |
| 5,969,850 A | 10/1999 | Harrold et al. |
| 6,094,216 A | 7/2000 | Taniguchi et al. |
| 6,246,451 B1 | 6/2001 | Matsumura et al. |
| 6,294,274 B1 | 9/2001 | Kawazoe et al. |
| 6,307,585 B1 | 10/2001 | Hentschke |
| 6,377,230 B1 | 4/2002 | Yamazaki et al. |
| 6,496,218 B2 | 12/2002 | Takigawa et al. |
| 6,563,174 B2 | 5/2003 | Kawasaki et al. |
| 6,597,348 B1 | 7/2003 | Yamazaki et al. |
| 6,727,522 B1 | 4/2004 | Kawasaki et al. |
| 6,882,012 B2 | 4/2005 | Yamazaki et al. |
| 6,970,290 B1 | 11/2005 | Mashitani et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,145,536 B1 | 12/2006 | Yamazaki et al. |
| 7,193,593 B2 | 3/2007 | Koyama et al. |
| 7,211,825 B2 | 5/2007 | Shih et al |
| 7,224,339 B2 | 5/2007 | Koyama et al. |
| 7,268,756 B2 | 9/2007 | Koyama et al. |
| 7,282,782 B2 | 10/2007 | Hoffman et al. |
| 7,297,977 B2 | 11/2007 | Hoffman et al. |
| 7,317,438 B2 | 1/2008 | Yamazaki et al. |
| 7,323,356 B2 | 1/2008 | Hosono et al. |
| 7,385,224 B2 | 6/2008 | Ishii et al. |
| 7,385,579 B2 | 6/2008 | Satake |
| 7,402,506 B2 | 7/2008 | Levy et al. |
| 7,411,209 B2 | 8/2008 | Endo et al. |
| 7,425,937 B2 | 9/2008 | Inukai |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,609,445 B2 | 10/2009 | Hamagishi |
| 7,674,650 B2 | 3/2010 | Akimoto et al. |
| 7,732,819 B2 | 6/2010 | Akimoto et al. |
| 7,791,571 B2 | 9/2010 | Ohtani et al. |
| 7,804,088 B2 | 9/2010 | Tanaka et al. |
| 7,923,723 B2 | 4/2011 | Hayashi et al. |
| 8,878,172 B2 | 11/2014 | Ito et al. |
| 9,111,806 B2 | 8/2015 | Ito et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0128347 A1* | 7/2003 | Case ............... G03F 7/70283 355/53 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0239231 A1 | 12/2004 | Miyagawa et al. |
| 2004/0240777 A1 | 12/2004 | Woodgate et al. |
| 2005/0001787 A1 | 1/2005 | Montgomery et al. |
| 2005/0012097 A1 | 1/2005 | Yamazaki |
| 2005/0017302 A1 | 1/2005 | Hoffman |
| 2005/0199959 A1 | 9/2005 | Chiang et al. |
| 2005/0225502 A1 | 10/2005 | Nam et al. |
| 2005/0264560 A1 | 12/2005 | Hartkop et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0126177 A1 | 6/2006 | Kim et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0091638 A1 | 4/2007 | Ijzerman et al. |
| 2007/0108446 A1 | 5/2007 | Akimoto |
| 2007/0152217 A1 | 7/2007 | Lai et al. |
| 2007/0152921 A1 | 7/2007 | Osame |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0279359 A1 | 12/2007 | Yoshida et al. |
| 2007/0279374 A1 | 12/2007 | Kimura et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0043092 A1 | 2/2008 | Evans et al. |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0102752 A1 | 4/2009 | Honda |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0250695 A1 | 10/2009 | Tanaka et al. |
| 2009/0278122 A1 | 11/2009 | Hosono et al. |
| 2009/0280600 A1 | 11/2009 | Hosono et al. |
| 2009/0321737 A1 | 12/2009 | Isa et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148177 A1 | 6/2010 | Koyama et al. |

(56) References Cited

U.S. PATENT DOCUMENTS

| | | |
|---|---|---|
| 2010/0157181 A1 | 6/2010 | Takahashi |
| 2010/0182282 A1 | 7/2010 | Kurokawa et al. |
| 2010/0193782 A1 | 8/2010 | Sakata |
| 2010/0259697 A1 | 10/2010 | Sakamoto et al. |
| 2010/0265230 A1 | 10/2010 | Kang |
| 2010/0328438 A1 | 12/2010 | Ohyama et al. |
| 2011/0051239 A1 | 3/2011 | Daiku |
| 2011/0090184 A1 | 4/2011 | Yamazaki et al. |
| 2011/0128275 A1 | 6/2011 | Ueda et al. |
| 2011/0157168 A1 | 6/2011 | Bennett et al. |
| 2011/0157696 A1 | 6/2011 | Bennett et al. |
| 2011/0164034 A1 | 7/2011 | Bennett et al. |
| 2011/0169821 A1 | 7/2011 | Ishiguchi |
| 2011/0181827 A1 | 7/2011 | Takahashi et al. |
| 2011/0242100 A1 | 10/2011 | Yamazaki et al. |
| 2012/0154696 A1 | 6/2012 | Koyama |
| 2012/0206325 A1 | 8/2012 | Yamazaki et al. |
| 2012/0206503 A1 | 8/2012 | Hirakata et al. |
| 2012/0218325 A1 | 8/2012 | Hiroki et al. |
| 2015/0380566 A1 | 12/2015 | Ito et al. |

FOREIGN PATENT DOCUMENTS

| | | |
|---|---|---|
| EP | 0744872 A | 11/1996 |
| EP | 0751690 A | 1/1997 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-122733 A | 5/1993 |
| JP | 05-251705 A | 9/1993 |
| JP | 08-036145 A | 2/1996 |
| JP | 08-264794 A | 10/1996 |
| JP | 09-073049 A | 3/1997 |
| JP | 09-074574 A | 3/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-259395 A | 9/2003 |
| JP | 2004-103957 A | 4/2004 |
| JP | 2004-273614 A | 9/2004 |
| JP | 2004-273732 A | 9/2004 |
| JP | 2004-294914 A | 10/2004 |
| JP | 2005-092103 A | 4/2005 |
| JP | 2005-258013 A | 9/2005 |
| JP | 2005-293916 A | 10/2005 |
| JP | 2007-036127 A | 2/2007 |
| JP | 2007-250982 A | 9/2007 |
| JP | 2010-003822 A | 1/2010 |
| JP | 2010-073881 A | 4/2010 |
| JP | 2010-074148 A | 4/2010 |
| JP | 2010-103360 A | 5/2010 |
| JP | 2010-128306 A | 6/2010 |
| JP | 2010-251156 A | 11/2010 |
| JP | 2010-256815 A | 11/2010 |
| JP | 2011-013778 A | 1/2011 |
| WO | WO-2004/114391 | 12/2004 |
| WO | WO-2007/108293 | 9/2007 |
| WO | WO-2010/021349 | 2/2010 |

OTHER PUBLICATIONS

Written Opinion (Application No. PCT/JP2012/053198) Dated Mar. 13, 2012.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-O TFTs", SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07, : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H at al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Kitzerow.H et al. "Observation of Blue Phases in Chiral Networks", Liquid Crystals, 1993, vol. 14, No. 3, pp. 911-916.

Kurokawa.Y et al., "UHF RFCPUS on Flexible and Glass Substrates for secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(Zn)m (M=In, Ga; m=Integar) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical.Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B. (Physical Reivew. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide. Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J at al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Parks et al., "Challenge to Future Displays: Transparent AM-OLED Driven by Peald Grown ZnO TFT", IMID '07 Digest, 2007, pp. 1249-1252.

(56) References Cited

OTHER PUBLICATIONS

Park.Sang-Hee at al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J at al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M at al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K at al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

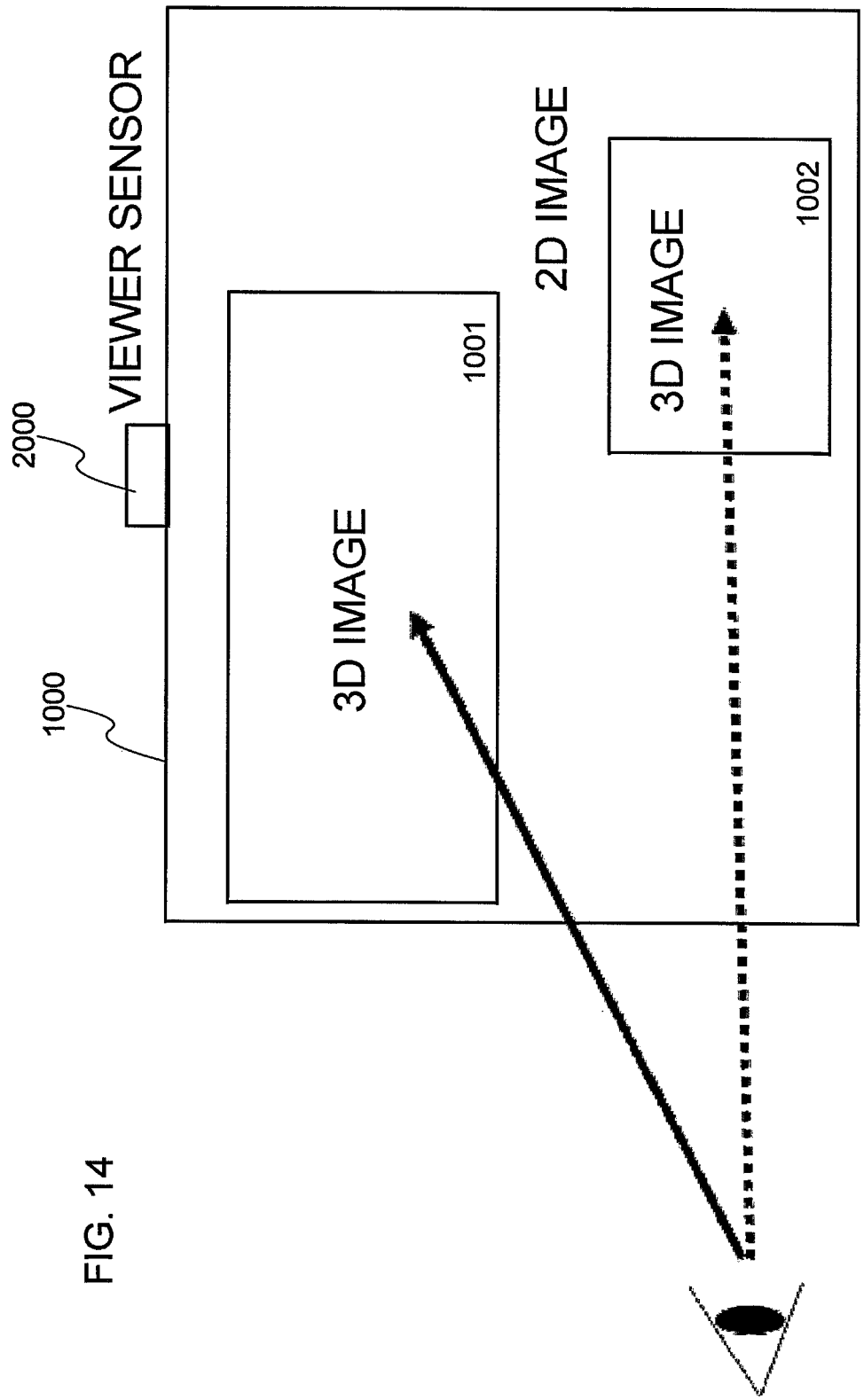

DISPLAY DEVICE

TECHNICAL FIELD

The present invention relates to display devices. In particular, the present invention relates to display devices capable of displaying three-dimensional (3D) images.

BACKGROUND ART

The market for 3D display devices is expanding. A difference in retinal images seen by both eyes (binocular disparity) that occurs when a user sees a 3D object by both eyes is produced in a display device, so that a 3D image can be displayed. 3D display devices using such binocular disparity with a variety of display methods have been developed and commercialized. Among such display devices, small display devices such as personal digital assistants or portable game machines mainly adopt a direct-view display method using an optical system such as a parallax barrier, a lenticular lens, or a microlens array.

For example, Patent Document 1 discloses a technique for displaying a 3D image by a parallax barrier so that a right eye sees an image for the right eye and a left eye sees an image for the left eye.

REFERENCE

Patent Document 1: Japanese Published Patent Application No. 8-036145.

DISCLOSURE OF INVENTION

It is an object of one embodiment of the present invention to provide a display device capable of displaying both a 3D image and a two-dimensional (2D) image.

One embodiment of the present invention is a display device that includes a display panel including a plurality of pixel regions arranged in matrix and a light-blocking panel including a plurality of optical shutter regions arranged in matrix. The optical shutter region includes a switch and a liquid crystal element whose light transmission is selected depending on a signal input through the switch. The light-blocking panel is provided in a direction in which light is emitted from the display panel.

The display panel displays an image by control of alignment of a liquid crystal. A display device including such a display panel is also one embodiment of the present invention.

A display device includes a display panel including a plurality of pixel regions arranged in matrix and a light-blocking panel including a plurality of optical shutter regions arranged in matrix. The pixel region includes a light-emitting element emitting white light by organic electroluminescence and a color filter for transmitting light in a specific wavelength range included in the white light emitted from the light-emitting element and for changing the white light into light with a chromatic color. The optical shutter region includes a switch and a liquid crystal element whose light transmission is selected depending on a signal input through the switch. The light-blocking panel is provided in a direction in which light is emitted from the display panel. Such a display device is also one embodiment of the present invention.

A display device includes a display panel including a plurality of pixel regions arranged in matrix and a light-blocking panel including a plurality of optical shutter regions arranged in matrix. The pixel region includes a light-emitting element emitting light with a chromatic color by organic electroluminescence. The optical shutter region includes a switch and a liquid crystal element whose light transmission is selected depending on a signal input through the switch. The light-blocking panel is provided in a direction in which light is emitted from the display panel. Such a display device is also one embodiment of the present invention.

In a display device according to one embodiment of the present invention, binocular disparity can be produced by a light-blocking panel. Further, the light-blocking panel can select whether to transmit light emitted from a display panel in each of a plurality of optical filter regions. Thus, in the display device, some regions where binocular disparity is produced can be provided. Consequently, the display device according to one embodiment of the present invention can display both a 3D image and a 2D image.

BRIEF DESCRIPTION OF DRAWINGS

In the accompanying drawings:

FIG. 14 illustrates a display device in Example 4;

BEST MODE FOR CARRYING OUT THE INVENTION

An embodiment and examples of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiment and the examples.

First, a display device according to one embodiment of the present invention is described with reference to FIGS. 1A and 1B and FIGS. 2A and 2B.

Structure Example of Display Device

Figure 1A:
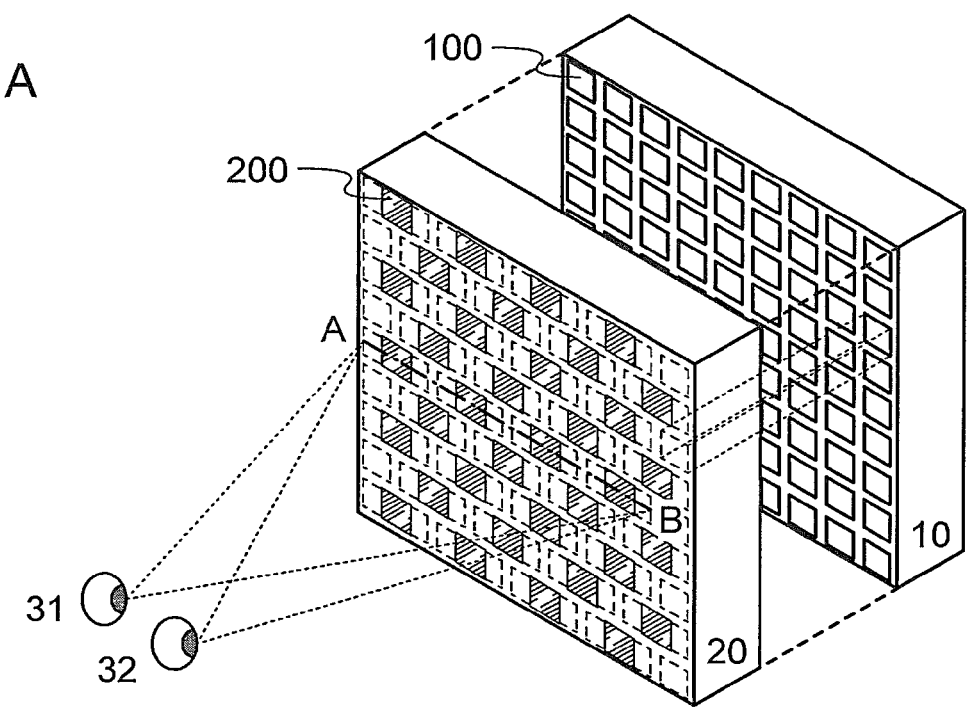
FIGS. 1A and 1B are schematic diagrams illustrating a structure example of a display device.

FIG. 1A is a schematic diagram illustrating a display device according to one embodiment of the present invention. The display device in FIG. 1A includes a display panel 10 including a plurality of pixel regions 100 arranged in matrix and a light-blocking panel 20 including a plurality of optical shutter regions 200 arranged in matrix. Note that the light-blocking panel 20 is provided in a direction in which light is emitted from the display panel 10. The light-blocking panel 20 can block display of an image viewed by a user in each of the plurality of optical shutter regions 200. Note that here, the light-blocking panel 20 does not block display of an image viewed by the user in regions other than the plurality of optical shutter regions 200. Further, in FIG. 1A, dotted lines in the light-blocking panel 20 indicate regions onto which images in the pixel regions 100 provided in the display panel 10 are focused.

Note that as the display panel 10 in FIG. 1A, a panel for displaying images by control of alignment of liquid crystals (such a panel is also referred to as a liquid crystal display device), a panel for displaying images by organic electroluminescence (also referred to as organic EL) (such a panel is also referred to as an EL display device), or the like can be used. Further, as the light-blocking panel 20 in FIG. 1A, a panel for selecting whether to block light by control of alignment of liquid crystals, a panel for selecting whether to block light with the use of a micro-electro-mechanical systems (MEMS) switch as an optical shutter, or the like can be used.

Figure 1B:
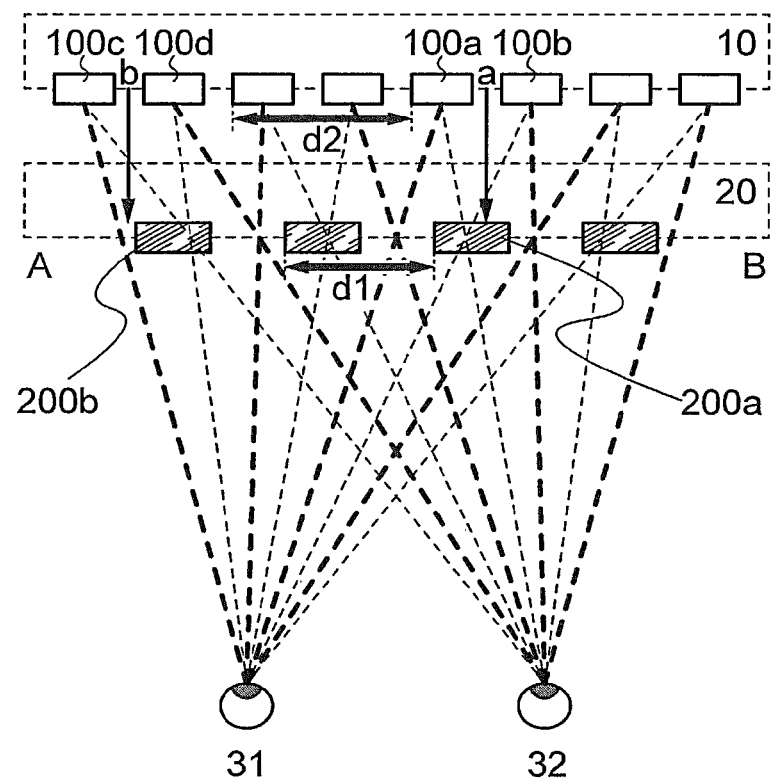

FIG. 1B is a schematic diagram illustrating the structure of the display device in FIG. 1A taken along broken line A-B. The optical shutter region 200 is provided so that one of a left eye 31 and a right eye 32 views an image in the specific pixel region 100 directly (without the optical shutter region 200) and the other of the left eye 31 and the right eye 32 views the image in the specific pixel region 100 through the optical shutter region 200 when the user sees the display device from a specific distance. Specifically, the left eye 31 directly views an image in a pixel region 100a and the right eye 32 views the image in the pixel region 100a through an optical shutter region 200a when the user sees the display device from the specific distance. Thus, a user's eyes can view an image in the pixel region 100a when display of an image in the pixel region 100a is not blocked in the optical shutter region 200a or only the left eye 31 of the user can view an image in the pixel region 100a when display of an image in the pixel region 100a is blocked in the optical shutter region 200a.

In short, the plurality of optical shutter regions each have a function of selecting whether the left eye views an image in the specific pixel region and a function of selecting whether the right eye views an image in a pixel region adjacent to the specific pixel region. Note that the plurality of optical shutter regions are different in positional relation between the optical shutter region and the two pixel regions (the pixel region in which whether an image is viewed by the left eye is selected by the optical shutter and the pixel region in which whether an image is viewed by the right eye is selected by the optical shutter). Specifically, the pixel region 100a and a pixel region 100b are pixel regions in which whether an image is viewed by the left eye 31 or the right eye 32 is selected by the optical shutter region 200a, and a pixel region 100c and a pixel region 100d are pixel regions in which whether an image is viewed by the left eye 31 or the right eye 32 is selected by an optical shutter region 200b. It is apparent from FIG. 1B that the positional relation between the optical shutter region 200a and the pixel regions 100a and 100b is different from the positional relation between the optical shutter region 200b and the pixel regions 100c and 100d. For example, in FIG. 1B, an arrow starting from a symbol a indicates the center of the pixel region 100a and the pixel region 100b, and an arrow starting from a symbol b indicates the center of the pixel region 100c and the pixel region 100d. It is apparent that the positional relations are different from the fact that the arrow starting from the symbol a reaches the optical shutter region 200a and the arrow starting from the symbol b does not reach the optical shutter region 200b.

Note that in order to display a 3D image to be described later, it is necessary that the plurality of optical shutter regions be different in positional relation between the optical shutter region and the corresponding two pixel regions or that the positional relation between an optical shutter region included in a specific region and corresponding two pixel regions be different from the positional relation between an optical shutter region included in a region other than the specific region and corresponding two pixel regions, though the positional relation between the optical shutter region included in the specific region and the corresponding two pixel regions is common. For example, it is necessary that the positional relation between an optical shutter region in the center of a screen and corresponding two pixel regions be different from the positional relation between an optical shutter region included at an end of the screen and corresponding two pixel regions. Here, the positional relations are changed depending on specifications (e.g., assumption of a distance of the user's eyes). Note that in order to display a 3D image, it is necessary that the pitch of the optical shutter region (indicated by d1 in FIG. 1B) be smaller than the pitch of adjacent two pixel regions (indicated by d2 in FIG. 1B). In short, a distance from one end to an opposing end of all the optical shutter regions provided in the light-blocking panel is shorter than a distance from one end to an opposing end of all the pixel regions provided in the display panel.

Note that the meaning of the expression "the positional relation between an optical shutter region included in a specific region and corresponding two pixel regions is different from the positional relation between an optical shutter region included in a region other than the specific region and corresponding two pixel regions, though the positional relation between the optical shutter region included in the specific region and the corresponding two pixel regions is common" in the above paragraph is as follows. For example, although "the positional relation between hundred pairs of an optical shutter region and corresponding two pixel regions" in the display device is common, the common positional relation of the hundred pairs is different from "the positional relation between a pair of an optical shutter region and corresponding two pixel regions which is other than the hundred pairs".

Figure 2A:
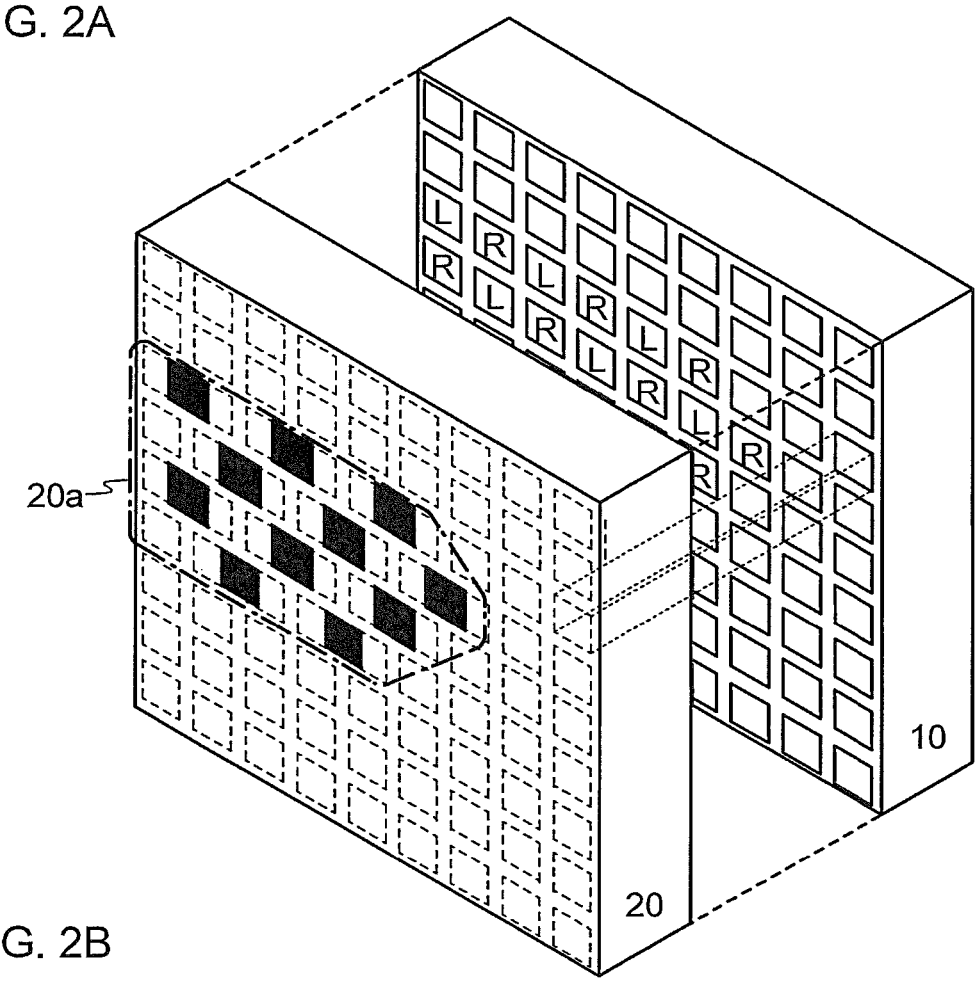
FIGS. 2A and 2B are schematic diagrams illustrating the operating state of the display device.
Figure 2B:
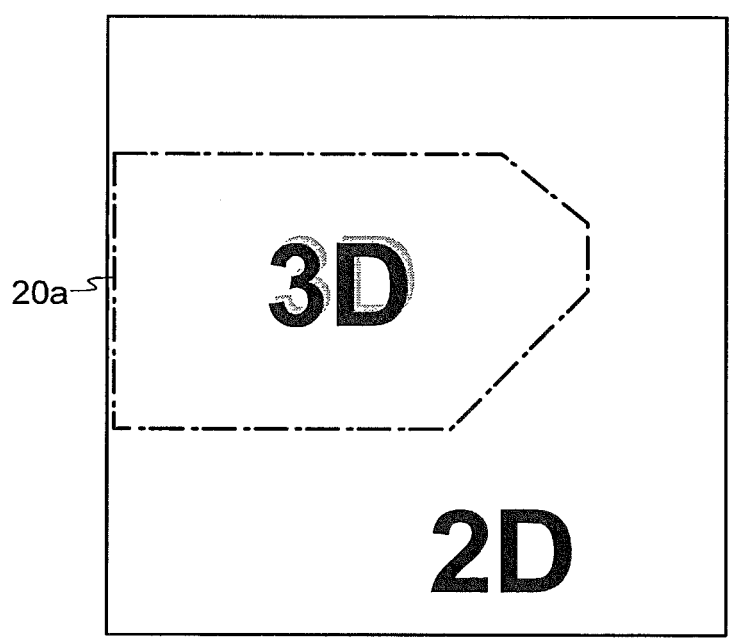

FIG. 2A is a schematic diagram illustrating the specific operating state of the display device in FIG. 1A. In the operating state in FIG. 2A, among the plurality of pixel regions 100 included in the display panel 10, in the pixel region 100 in which the user views an image through a region 20a in the light-blocking panel 20, a 3D image (L) for the left eye or a 3D image (R) for the right eye is displayed, and 2D images are displayed in the pixel regions 100 other than the region. Then, display of an image is blocked in the plurality of optical shutter regions 200 in the region 20a of the light-blocking panel 20, and display of an image is not blocked in regions other than the region 20a. Specifically, in each of the optical shutter regions 200, display of an image is blocked so that in the two pixel regions 100 adjacent to each other in a lateral direction (in a direction in which a parallax between the left eye and the right eye of the user exists), the right eye 32 of the user does not view an image in the pixel region 100 that is provided on a left side and displays a 3D image (L) for the left eye, and the left eye 31 of the user does not view an image in the pixel region 100 that is provided on a right side and displays a 3D image (R) for the right eye. Thus, a 3D image can be displayed in the specific region (the region 20a). Consequently, the display device according to one embodiment of the present invention can display both a 3D image in the region 20a and 2D images in regions other than the region 20a (see FIG. 2B).

Modification Example of Display Device

The display device according to one embodiment of the present invention is not limited to the display device in FIG. 1A. For example, any of display devices in FIGS. 3A to 3C can be used as the display device according to one embodiment of the present invention.

Figure 3A:
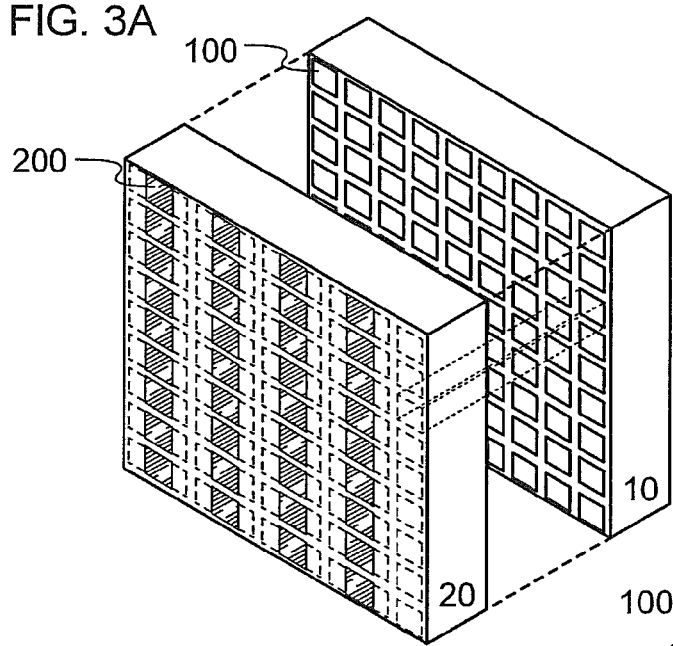
FIGS. 3A to 3C are schematic diagrams illustrating modification examples of the display device.

The display device in FIG. 3A differs from the display device in FIG. 1A in that optical filter regions in the light-blocking panel 20 are arranged in a stripe pattern. Further, the operating state of the display device in FIG. 3A differs from the operating state of the display device in FIG. 2A in that when the display device in FIG. 3A displays a 3D image, a 3D image (L) for the left eye or a 3D image (R) for the right eye is displayed on the display panel 10 per column in a plurality of pixel regions arranged in matrix.

Figure 3B:
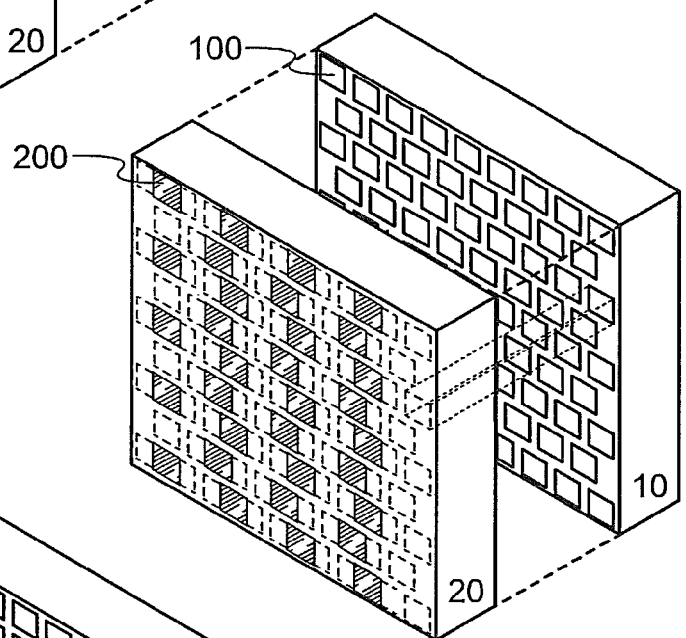

The display device in FIG. 3B differs from the display device in FIG. 1A in that a plurality of pixel regions in the display panel 10 are arranged in a delta pattern.

Figure 3C:
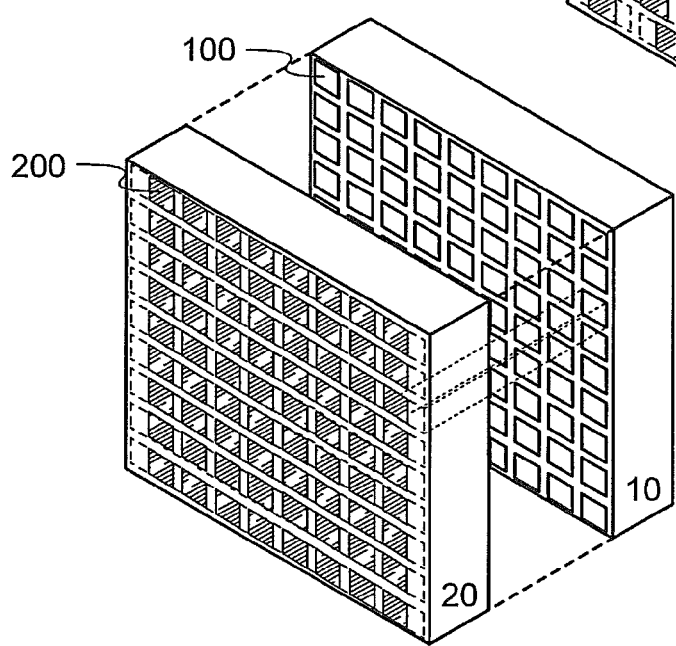

The display device in FIG. 3C differs from the display device in FIG. 1A in that optical shutter regions whose number is the same or substantially the same as the number of optical shutter regions in the pixel region 100 of the display panel 10 are provided in the light-blocking panel 20. In the display device in FIG. 3C, the display panel 10 can display an image only in the pixel region 100 that exists in a specific region. Thus, as compared to the display device in FIG. 1A, crosstalk during display of a 3D image can be reduced.

First Specific Example of Display Panel 10

Figure 4A:
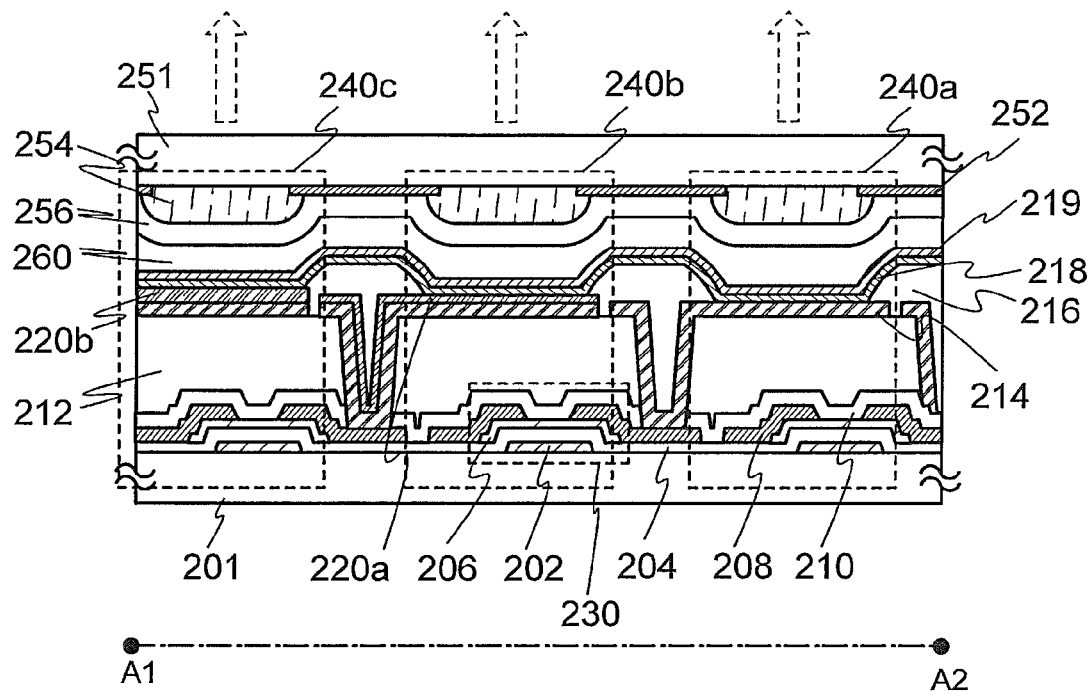
FIGS. 4A to 4C are a cross-sectional view and plan views illustrating a specific example of a pixel region included in the display panel.
Figure 4B:
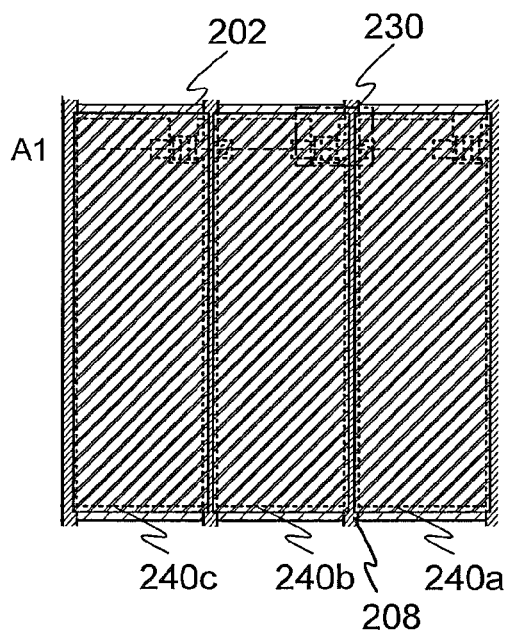
Figure 4C:
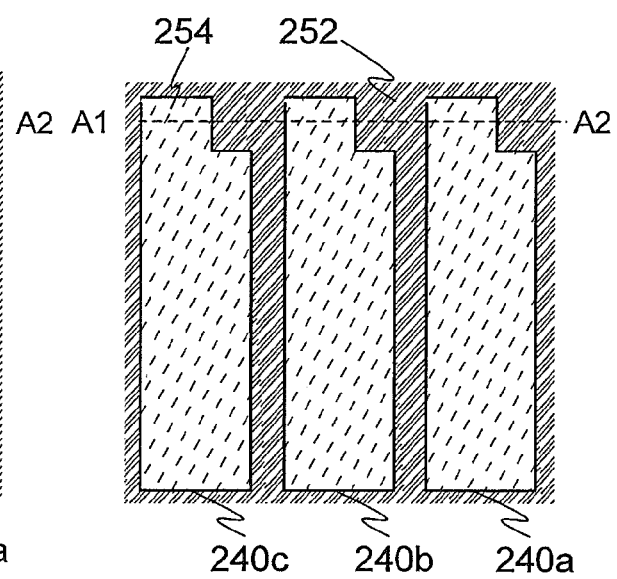

A specific example of the display panel 10 is described with reference to FIGS. 4A to 4C. Note that FIG. 4A is a cross-sectional view of the pixel region 100 that includes a light-emitting element emitting white light by organic electroluminescence and a color filter that transmits light in a specific wavelength range included in the white light emitted from the light-emitting element and changes the white light into light with a chromatic color. FIGS. 4B and 4C are plan views of the pixel region 100 in FIG. 4A.

The display panel in FIG. 4A emits light (displays an image) in a direction indicated by arrows in FIG. 4A. That is, the display panel has a so-called top-emission structure in which light is emitted not through a first substrate 201 provided with a light-emitting layer 218 but through a second substrate 251. Note that the light-emitting layer 218 emits white light by organic electroluminescence.

FIG. 4B is a plan view of the first substrate 201 seen from a transflective electrode layer 219 side, and FIG. 4C is a plan view of the second substrate 251 seen from a light-blocking film 252 side. Note that FIG. 4A is a cross-sectional view taken along broken line A1-A2 in FIGS. 4B and 4C. In the plan views in FIGS. 4B and 4C, some components (e.g., the light-emitting layer 218) are not illustrated in order to avoid complex views.

As illustrated in FIG. 4A, a blue pixel 240a, a green pixel 240b, and a red pixel 240c are provided between the first substrate 201 and the second substrate 251. Further, a transistor 230 for controlling drive of the light-emitting element and a reflective electrode layer 214 that is electrically connected to the transistor 230 are provided over the first substrate 201.

Note that here, the blue pixel 240a includes a light-emitting element that has emission intensity in a blue region, the green pixel 240b includes a light-emitting element that has emission intensity in a green region, and the red pixel 240c includes a light-emitting element that has emission intensity in a red region. These light-emitting elements function as micro-cavities to intensify desired emission spectra.

In the blue pixel 240a, the light-emitting layer 218 is directly formed on the reflective electrode layer 214 as the light-emitting element that has emission intensity in the blue region, and the transflective electrode layer 219 is formed over the light-emitting layer 218.

In the green pixel 240b, a first transparent electrode layer 220a is formed over the reflective electrode layer 214 as the light-emitting element that has emission intensity in the green region, the light-emitting layer 218 is formed over the first transparent electrode layer 220a, and the transflective electrode layer 219 is formed over the light-emitting layer 218.

In the red pixel 240c, a second transparent electrode layer 220b is formed over the reflective electrode layer 214 as the light-emitting element that has emission intensity in the red region, the light-emitting layer 218 is formed over the second transparent electrode layer 220b, and the transflective electrode layer 219 is formed over the light-emitting layer 218.

In this manner, the light-emitting elements of the pixels (the blue pixel 240a, the green pixel 240b, and the red pixel 240c) are different in structure between the reflective electrode layer 214 and the transflective electrode layer 219.

The second substrate 251 is provided with a light-blocking film 252 that functions as a black matrix, a color filter 254, and an overcoat 256. The color filter 254 is a colored layer, which transmits light of colors (blue, green, and red) emitted from the light-emitting elements and emits light from the light-emitting layer 218 to a second substrate 251 side.

In this manner, it can be said that the light-emitting elements of the pixels (the blue pixel 240a, the green pixel 240b, and the red pixel 240c) are different in optical distance when the optical path length between the reflective electrode layer 214 and the transflective electrode layer 219 is changed. This optical distance may be optical path length with which a spectrum needed for the light-emitting element of each pixel is amplified by a resonance effect. Only in the light-emitting element that has emission intensity in the blue region provided in the blue pixel 240*a*, the light-emitting layer 218 is directly formed on the reflective electrode layer 214 and the transflective electrode layer 219 is formed over the light-emitting layer 218. In other words, transparent electrode layers (the first transparent electrode layer 220*a* and the second transparent electrode layer 220*b*) are not formed.

With such a structure, a transparent electrode layer to be formed in the blue pixel 240*a* is not needed; thus, the number of steps and cost can be reduced.

Note that there is no particular limitation on a space 260 between the first substrate 201 and the second substrate 251 as long as the space 260 transmits light. It is preferable that the space 260 be filled with a light-transmitting material whose refractive index is higher than that of the air. In the case where the refractive index is low, light emitted from the light-emitting layer 218 in an oblique direction is further refracted by the space 260, and light is emitted from an adjacent pixel in some cases. Thus, for example, the space 260 can be filled with a light-transmitting adhesive having high refractive index and capable of bonding the first substrate 201 and the second substrate 251 to each other. Alternatively, an inert gas such as nitrogen or argon or the like can be used.

Next, the details of the display panel in FIGS. 4A to 4C and a method for manufacturing the display panel are described.

First, a method for forming the first substrate 201 provided with the transistor 230 for controlling drive of the light-emitting element, the light-emitting layer 218, and the like is described below.

A conductive layer is formed over the first substrate 201 having an insulating surface, and then, a first photolithography process is performed so that a resist mask is formed. An unnecessary portion of the conductive layer is etched away, so that a gate electrode layer 202 is formed. Etching is preferably performed so that end portions of the gate electrode layer 202 are tapered as illustrated in FIG. 4A because coverage with a film stacked thereover is improved.

Although there is no particular limitation on a substrate which can be used as the first substrate 201, it is necessary that the substrate have at least heat resistance high enough to withstand heat treatment to be performed later. For example, a glass substrate can be used as the first substrate 201.

In the case where the temperature of the heat treatment to be performed later is high, a glass substrate whose strain point is 730° C. or higher is preferably used as the glass substrate. For the glass substrate, a glass material such as aluminosilicate glass, aluminoborosilicate glass, or barium borosilicate glass is used, for example. Note that in general, by containing more barium oxide (BaO) than boron oxide ($B_2O_3$), a more practical heat-resistant glass substrate can be obtained. Thus, a glass substrate containing more BaO than $B_2O_3$ is preferably used.

Note that instead of the glass substrate, a substrate formed using an insulator, such as a ceramic substrate, a quartz substrate, or a sapphire substrate, may be used. Alternatively, crystallized glass or the like can be used. The display panel has a top-emission structure in which light is extracted through the second substrate 251; thus, a non-light-transmitting substrate such as a metal substrate can be used as the first substrate 201.

An insulating film which serves as a base film may be provided between the first substrate 201 and the gate electrode layer 202. The base film has a function of preventing diffusion of an impurity element from the first substrate 201, and can be formed to have a single-layer structure or a layered structure using one or more films selected from a silicon nitride film, a silicon oxide film, a silicon nitride oxide film, and a silicon oxynitride film.

The gate electrode layer 202 can be formed to have a single-layer structure or a layered structure using a metal material such as molybdenum, titanium, chromium, tantalum, tungsten, aluminum, copper, neodymium, or scandium, or an alloy material containing any of these metal materials as a main component.

Next, a gate insulating layer 204 is formed over the gate electrode layer 202. The gate insulating layer 402 can be formed to have a single-layer structure or a layered structure including a silicon oxide layer, a silicon nitride layer, a silicon oxynitride layer, a silicon nitride oxide layer, or an aluminum oxide layer by plasma-enhanced CVD, sputtering, or the like. For example, a silicon oxynitride film may be formed using $SiH_4$ and $N_2O$ as a deposition gas by plasma-enhanced CVD.

Next, a semiconductor layer is formed, and an island-shaped semiconductor layer 206 is formed through a second photolithography process.

The semiconductor layer 206 can be formed using a silicon semiconductor or an oxide semiconductor. Single crystal silicon, polycrystalline silicon, microcrystalline silicon, amorphous silicon, or the like can be used as the silicon semiconductor. A four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single-component metal oxide such as an In—O-based oxide semiconductor, a Sn—O-based oxide semiconductor, or a Zn—O-based oxide semiconductor; or the like can be used as the oxide semiconductor. Note that in this specification, for example, an In—Sn—Ga—Zn—O-based oxide semiconductor is a metal oxide containing indium (In), tin (Sn), gallium (Ga), and zinc (Zn), and there is no particular limitation on the stoichiometric proportion thereof. The oxide semiconductor may contain silicon. An oxide semiconductor which is an In—Ga—Zn—O-based metal oxide is preferably used as the semiconductor layer 206 so that the semiconductor layer has low off-state current because leakage current in an off state can be reduced.

Next, a conductive film is formed over the gate insulating layer 204 and the semiconductor layer 206, and a source and drain electrode layers 208 are formed through a third photolithography process.

As the conductive film used for the source and drain electrode layers 208, for example, a metal film including an element selected from Al, Cr, Cu, Ta, Ti, Mo, or W, a metal nitride film including the above element as its component (e.g., a titanium nitride film, a molybdenum nitride film, or a tungsten nitride film), or the like can be used. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film of Al, Cu, or the like. Alternatively, the conductive film used for the source and drain electrode layers 208 may be formed using a conductive metal oxide. Indium oxide ($In_2O_3$), tin oxide ($SnO_2$), zinc oxide (ZnO), ITO, an alloy of indium oxide and zinc oxide ($In_2O_3$—ZnO), or any of these metal oxide materials containing silicon oxide can be used as the conductive metal oxide.

Next, an insulating layer 210 is formed over the semiconductor layer 206 and the source and drain electrode layers 208. An inorganic insulating film such as a silicon oxide film or a silicon oxynitride film can be used as the insulating layer 210.

Then, an insulating layer 212 is formed over the insulating layer 210.

As the insulating layer 212, an insulating film with a planarization function is preferably selected in order to reduce surface unevenness due to the transistor. For example, an organic material such as polyimide, acrylic, or benzocyclobutene can be used. Other than such organic materials, a low-dielectric constant material (a low-k material) or the like can be used. Note that the insulating layer 212 may be formed by a stack of a plurality of insulating films formed using these materials.

Next, an opening which reaches the source and drain electrode layers 208 is formed in the insulating layer 212 and the insulating layer 210 through a fourth photolithography process. As a method for forming the opening, dry etching, wet etching, or the like may be selected as appropriate.

Next, a conductive film is formed over the insulating layer 212 and the source and drain electrode layers 208, and a reflective electrode layer 214 is formed through a fifth photolithography process.

For the reflective electrode layer 214, a material which efficiently reflects light emitted from the light-emitting layer 218 is preferably used because light extraction efficiency can be improved. Note that the reflective electrode layer 214 may have a layered structure. For example, a conductive film of a metal oxide, titanium, or the like can be formed thin on a side which is in contact with the light-emitting layer 218, and a metal film with high reflectance (a film of aluminum, an alloy containing aluminum, silver, or the like) can be used on a side opposite to the side which is in contact with the light-emitting layer 218. Such a structure is preferable because formation of an insulating film between the light-emitting layer 218 and the metal film with high reflectance (the film of aluminum, an alloy containing aluminum, silver, or the like) can be suppressed.

Next, a transparent conductive film is formed over the reflective electrode layer 214, and the first transparent electrode layer 220a is formed through a sixth photolithography process.

Then, a transparent conductive film is formed over the reflective electrode layer 214 and the first transparent electrode layer 220a, and the second transparent electrode layer 220b is formed through a seventh photolithography process. Note that only in the blue pixel 240a, the first transparent electrode layer and the second transparent electrode layer are not formed.

Indium oxide ($In_2O_3$), tin oxide ($SnO_2$), zinc oxide (ZnO), ITO, an alloy of indium oxide and zinc oxide ($In_2O_3$—ZnO), or any of these metal oxide materials containing silicon oxide can be used as a material which can be used for the first transparent electrode layer 220a and the second transparent electrode layer 220b.

Note that the method for forming the first transparent electrode layer 220a and the second transparent electrode layer 220b is not limited thereto. For example, a method can be used by which a transparent conductive film that has thickness needed for the second transparent electrode layer 220b is formed, only a portion to be the first transparent electrode layer 220a is subjected to dry etching, wet etching, or the like, and the transparent conductive film is removed to a thickness needed for the first transparent electrode layer 220a. Further, the second transparent electrode layer 220b may have a layered structure with the transparent conductive film used for the first transparent electrode layer 220a.

With the structure in which the transparent electrode layer is not formed only in the blue pixel 240a as described above, the number of masks can be reduced, and cost can be reduced by a reduction of an unnecessary step.

Then, a partition 216 is formed over the reflective electrode layer 214, the first transparent electrode layer 220a, and the second transparent electrode layer 220b.

The partition 216 is formed using an organic insulating material or an inorganic insulating material. It is particularly preferable that the partition 216 be formed using a photosensitive resin material to have an opening over the reflective electrode layer 214 in the blue pixel 240a, an opening over the first transparent electrode layer 220a in the green pixel 240b, and an opening over the second transparent electrode layer 220b in the red pixel 240c so that sidewalls of the openings have tilted surfaces with continuous curvature.

Then, the light-emitting layer 218 is formed over the reflective electrode layer 214, the first transparent electrode layer 220a, the second transparent electrode layer 220b, and the partition 216. The light-emitting layer 218 may have either a single-layer structure or a layered structure, and it is preferable that light emitted from the light-emitting layer 218 be light having a peak in each of red, green, and blue wavelength regions.

Next, the transflective electrode layer 219 is formed over the light-emitting layer 218.

Note that one of the reflective electrode layer 214 and the transflective electrode layer 219 functions as an anode of the light-emitting layer 218, and the other of the reflective electrode layer 214 and the transflective electrode layer 219 functions as a cathode of the light-emitting layer 218. It is preferable to use a substance having a high work function for the electrode layer which functions as an anode, and a substance having a low work function for the electrode layer which functions as a cathode.

Through the above steps, the first substrate 201 provided with the transistor 230 for controlling drive of the light-emitting element and the light-emitting layer 218 is formed.

Next, a method for forming the second substrate 251 provided with the light-blocking film 252, the color filter 254, and the overcoat 256 is described below.

First, a conductive film is formed on the second substrate 251, and the light-blocking film 252 is formed through an eighth photolithography process. The light-blocking film 252 can prevent color mixing among the pixels. Note that the light-blocking film 252 is not necessarily provided.

A metal film with low reflectance of titanium, chromium, or the like, an organic resin film impregnated with a black pigment or a black dye, or the like can be used as the light-blocking film 252.

Then, the color filter 254 is formed on the second substrate 251 and the light-blocking film 252.

The color filter 254 is a colored layer for transmitting light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position with a known material by a printing method, an inkjet method, etching using a photolithography technique, or the like.

Here, a method of using three colors of R, G, and B is described; however, this embodiment is not limited thereto. A structure in which four colors of R, G, B, and Y (yellow) are used or a structure in which five or more colors are used may be employed.

Next, the overcoat 256 is formed on the light-blocking film 252 and the color filter 254. The overcoat 256 can be formed using an organic resin film of acrylic, polyimide, or the like. The overcoat 256 can prevent an impurity component or the like contained in the color filter 254 from diffusing into a light-emitting layer 218 side. Further, the overcoat 256 may have a layered structure of an organic resin film and an inorganic film. Silicon nitride, silicon oxide, or the like can be used for the inorganic insulating film. Note that it is possible not to provide the overcoat 256.

Through the above steps, the second substrate 251 provided with the light-blocking film 252, the color filter 254, and the overcoat 256 is formed.

Further, the first substrate 201 and the second substrate 251 are aligned and attached to each other to be the display panel. There is no particular limitation on the method for attaching the first substrate 201 and the second substrate 251 to each other, and the first substrate 201 and the second substrate 251 can be attached to each other with a light-transmitting adhesive whose refractive index is high, for example.

As described above, in the display panel, the optical distance is changed between the light-emitting element and the blue pixel including the light-emitting element that has emission intensity in the blue region, the green pixel including the light-emitting element that has emission intensity in the green region, and the red pixel including the light-emitting element that has emission intensity in the red region. When a desired spectrum is intensified by a micro-cavity in each light-emitting element, a display panel with high color purity can be obtained. Further, since only the blue pixel including the light-emitting element that emits light of a blue wavelength does not include the transparent electrode layer, the number of steps and cost can be reduced.

Note that here, the display panel that has a top-emission (TE) structure in which a light-emitting element emitting white light and a color filter (CF) are used in combination (hereinafter abbreviated as a white+CF+TE structure) is described; however, a display panel that has a top-emission structure in which light-emitting elements are formed by a separate coloring method (hereinafter referred to as a separate coloring+TE structure) can be used as the display panel. The separate coloring method is a method for separately coloring R, G, and B materials in pixels by vapor deposition or the like.

Here, comparison between the display panel with the white+CF+TE structure and the display panel with the separate coloring+TE structure is described below.

First, in the white+CF+TE structure, coloring is performed using a color filter; thus, a color filter is needed. In contrast, in the separate coloring+TE structure, coloring is performed by separately coloring pixels by vapor deposition or the like; thus, a color filter is not needed. Consequently, in the separate coloring+TE structure, light emission at high luminance or low-power drive is possible.

Note that although the white+CF+TE structure needs a color filter, the separate coloring+TE structure needs a metal mask or the like for separate coloring. Separate coloring can be performed by an inkjet method or the like without a metal mask; however, it is difficult to employ such a method because of many technical problems. In the case where a metal mask is used, a vapor deposition material is also deposited on the metal mask; thus, material use efficiency is low and cost is high. Further, the metal mask is in contact with the light-emitting element, so that yield is decreased because of damage to the light-emitting element or generation of a scratch, a particle, or the like due to contact. Consequently, the white+CF+TE structure is better in terms of manufacturing cost or productivity.

In addition, it is possible to eliminate a polarizing plate from the white+CF+TE structure. In contrast, the separate coloring+TE structure needs a polarizing plate. An improvement in color purity by using a micro-cavity can be achieved in both the white+CF+TE structure and the separate coloring+TE structure.

In the separate coloring+TE structure, it is necessary to separately color the pixels and to provide a region necessary for separate coloring between the pixels; thus, the size of one pixel cannot be increased. Consequently, the aperture ratio is markedly decreased. In contrast, in the white+CF+TE structure, it is not necessary to provide a region necessary for separate coloring between the pixels; thus, the size of one pixel can be increased. Consequently, the aperture ratio can be improved.

In the case where the display panel is made large, a technique for manufacturing the display panel without problems is essential. It is difficult to employ the separate coloring+TE structure because a metal mask is needed for separate coloring and a technique of a metal mask and production equipment that are compatible with a large display panel are not established. Even if the technique of a metal mask and the production equipment that are compatible with a large display panel are established, the problem of material use efficiency, i.e., the fact that a vapor deposition material is also deposited on a metal mask, is not solved. In contrast, the white+CF+TE structure is preferable because a metal mask is not needed and manufacturing can be performed using conventional production equipment.

An apparatus for manufacturing a display panel greatly influence the productivity of a display panel. For example, in the case where a light-emitting element has a layered structure of a plurality of films, it is preferable that the apparatus for manufacturing a display panel be an in-line apparatus or a multi-chamber apparatus and that a plurality of vapor deposition sources be formed on a substrate once or successively. In the separate coloring+TE structure, it is necessary to separately color pixels and to manufacture the display panel while replacing metal masks so that the pixels are formed in desired positions. Since metal masks are replaced, it is difficult to use an in-line manufacturing apparatus or a multi-chamber manufacturing apparatus. In contrast, in the white+CF+TE structure, it is easy to use an in-line manufacturing apparatus or a multi-chamber manufacturing apparatus because a metal mask is not needed.

Second Specific Example of Display Panel 10

A specific example of the display panel 10 that is different from the specific example of the display panel 10 in FIGS.

4A to 4C is described with reference to FIGS. 5A and 5B. Note that FIGS. 5A and 5B are cross-sectional views of the pixel region 100 that includes the light-emitting element emitting white light by organic electroluminescence and the color filter that transmits light in a specific wavelength range included in the white light emitted from the light-emitting element and changes the white light into light with a chromatic color.

Although the display panel 10 in FIGS. 4A to 4C has a top-emission structure in which light is extracted from a surface that is opposite to the substrate provided with the transistor and the light-emitting element, a display panel with a bottom-emission structure is described below.

The display panel 10 with a bottom-emission structure is described with reference to FIG. 5A.

Figure 5A:
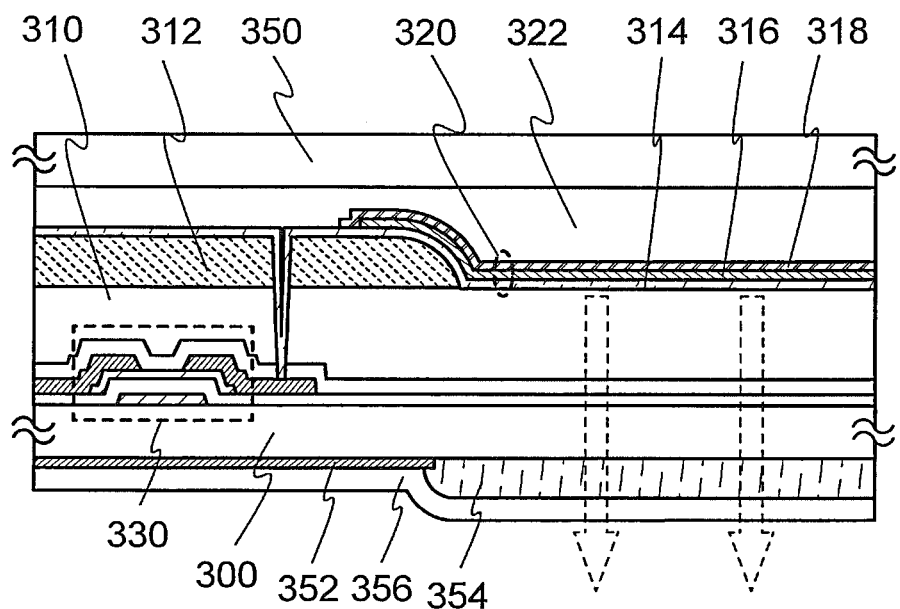
FIGS. 5A and 5B are cross-sectional views illustrating a specific example of a pixel region included in the display panel.
Figure 5B:
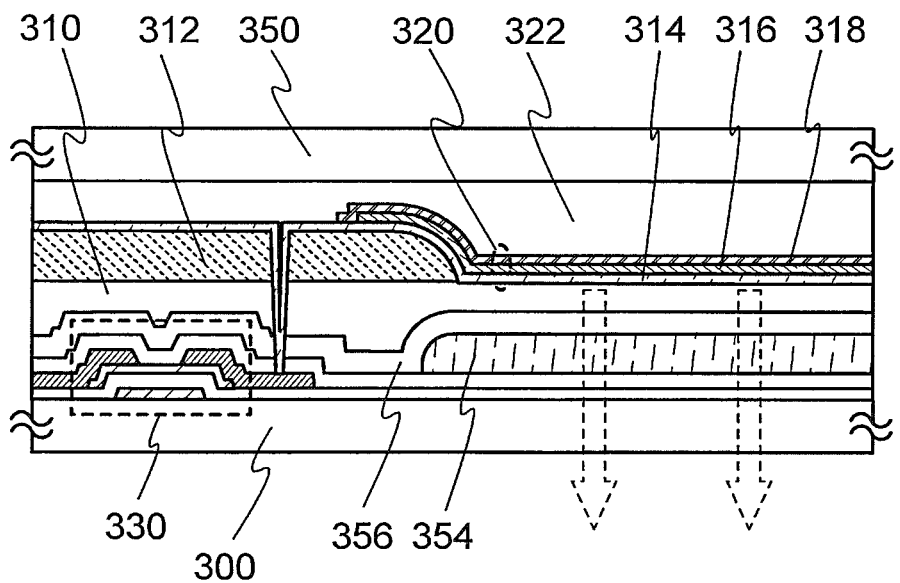

In FIG. 5A, a first substrate 300, a second substrate 350, a transistor 330 and a light-emitting element 320 that are held between the first substrate 300 and the second substrate 350, and a color filter 354 provided on a display surface (a surface to which light from the light-emitting element 320 is emitted) side of the first substrate 300 are included.

Although there is no particular limitation on a substrate which can be used as the first substrate 300, it is necessary that the substrate have at least heat resistance high enough to withstand heat treatment to be performed later. For example, a glass substrate can be used as the first substrate 300.

In the case where the temperature of the heat treatment to be performed later is high, a glass substrate whose strain point is 730° C. or higher is preferably used as the glass substrate. For the glass substrate, a glass material such as aluminosilicate glass, aluminoborosilicate glass, or barium borosilicate glass is used, for example. Note that in general, by containing more barium oxide (BaO) than boron oxide ($B_2O_3$), a more practical heat-resistant glass substrate can be obtained. Thus, a glass substrate containing more BaO than $B_2O_3$ is preferably used.

The transistor 330 can be formed in a manner similar to that of the transistor 230 in FIG. 4A.

The light-emitting element 320 is formed over an insulating layer 310 and a partition 312 that are formed over the transistor 330. A light-emitting layer 316 and a second electrode 318 are sequentially stacked over a first electrode 314 that is electrically connected to the transistor 330.

For the insulating layer 310, a material that can flatten unevenness due to the transistor 330 is preferably used. A material that can transmit light from the light-emitting element 320 is preferably used. For example, an acrylic resin having a high light-transmitting property can be used for the insulating layer 310. An organic resin film of polyimide, acrylic, polyamide, epoxy, or the like, an inorganic insulating film, or organic polysiloxane can be used for the partition 312.

A conductive film which transmits visible light is used as the first electrode 314. Indium oxide ($In_2O_3$), tin oxide ($SnO_2$), zinc oxide (ZnO), ITO, an alloy of indium oxide and zinc oxide ($In_2O_3$—ZnO), or any of these metal oxide materials containing silicon oxide can be used as the conductive film which transmits visible light, for example. Alternatively, a metal thin film having thickness small enough to transmit light (preferably, approximately 1 to 30 nm) can be used.

The light-emitting layer 316 can be formed in a manner similar to that of the light-emitting layer 218 in FIG. 4A.

For the second electrode 318, a material which efficiently reflects light emitted from the light-emitting layer 316 is preferably used because light extraction efficiency can be improved. Note that the second electrode 318 may have a layered structure. For example, for the second electrode 318, a conductive film of a metal oxide, titanium, or the like can be formed thin on a side which is in contact with the light-emitting layer 316 that contains a light-emitting substance, and a metal film with high reflectance (a film of aluminum, an alloy containing aluminum, silver, or the like) can be used on a side opposite to the side which is in contact with the light-emitting layer 316. Such a structure is preferable because formation of an insulating film between the light-emitting layer 316 and the metal film with high reflectance can be suppressed.

Any material can be used for the second substrate 350 as long as it can encapsulate the light-emitting element 320 and a transistor 330. Further, since the light-emitting device in FIG. 5A has the bottom-emission structure, a non-light-transmitting substrate may be used. For example, a glass substrate, a metal substrate, or the like can be used as appropriate as the second substrate 350.

A space 322 can be formed using a material and a method which are similar to those of the space 260. Further, a desiccant that can remove moisture or the like entering the light-emitting element 320 may be encapsulated in the space 322.

On a surface of the first substrate 300 to which light is emitted, the light-blocking film 352 functioning as a black matrix, a color filter 354, and an overcoat 356 are provided. The color filter 354 is a colored layer and changes white light emitted from each light-emitting element into light with a chromatic color (e.g., blue, green, or red).

In the display panel 10 according to one embodiment of the present invention, the color filter 354 and the overcoat 356 can be held between the first substrate 300 and the second substrate 350 (see FIG. 5B).

First Specific Example of Light-Blocking Panel 20

Figure 6A:
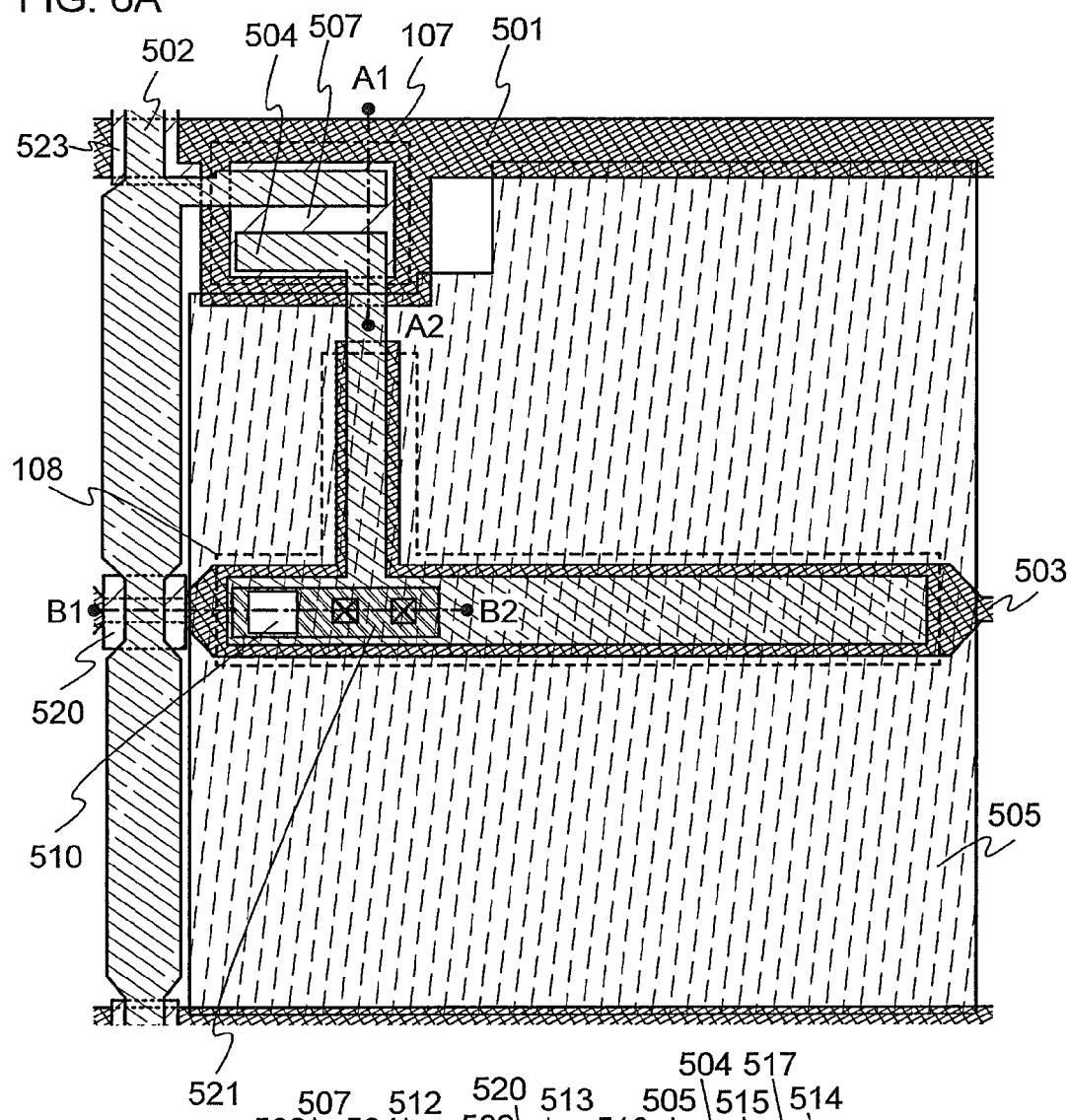
FIGS. 6A and 6B are a plan view and a cross-sectional view illustrating a specific example of an optical shutter region included in a light-blocking panel.
Figure 6B:
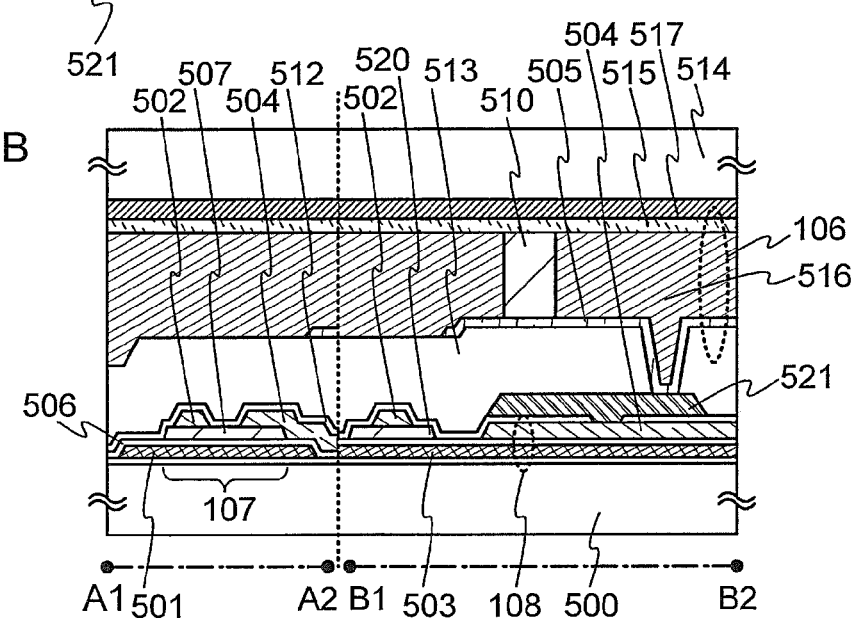

A specific example of the light-blocking panel 20 is described with reference to FIGS. 6A and 6B. Note that FIG. 6A is a plan view of an optical shutter region that includes a transistor and a liquid crystal element to which a signal is input through the transistor, and FIG. 6B is a cross-sectional view of the optical shutter region in FIG. 6A taken along broken line A1-A2 and broken line B1-B2. In the optical shutter region in FIG. 6A, voltage to be applied to the liquid crystal element depends on a signal to be input through the transistor. Thus, by controlling alignment of liquid crystals included in the liquid crystal element depending on the signal, whether the optical shutter region transmits light is selected. Note that in the display device according to one embodiment of the present invention, the transistor can be replaced with an element that functions as a switch. In other words, in the optical shutter region, any element can be provided as long as it functions as a switch. For example, the transistor can be replaced with a MEMS switch, a relay switch, or the like.

In the optical shutter region in FIGS. 6A and 6B, a conductive layer 501 functions as a gate electrode of a transistor 107. Further, a conductive layer 502 functions as one of a source and a drain of the transistor 107. A conductive layer 503 functions as one electrode of a capacitor 108. A conductive layer 504 functions as the other of the source and the drain of the transistor 107 or the other electrode of the capacitor 108.

A gate insulating layer 506 is formed over the conductive layer 501 and the conductive layer 503. A semiconductor layer 507 of the transistor 107 is formed over the gate insulating layer 506 to overlap with the conductive layer 501.

In the optical shutter region in FIGS. 6A and 6B, the gate insulating layer 506 and a semiconductor layer 520 are provided in a portion where the conductive layer 503 and the conductive layer 502 overlap with each other. Specifically, the gate insulating layer 506 is provided over the conductive layer 503, the semiconductor layer 520 is provided over the gate insulating layer 506, and the conductive layer 502 is provided over the semiconductor layer 520. When the semiconductor layer 520 is provided between the conductive layer 502 and the conductive layer 503, parasitic capacitance between the conductive layer 502 and the conductive layer 503 can be reduced.

In the optical shutter region in FIG. 6A, the gate insulating layer 506 and a semiconductor layer 523 are provided in a portion where the conductive layer 501 and the conductive layer 502 overlap with each other. Specifically, the gate insulating layer 506 is provided over the conductive layer 501, the semiconductor layer 523 is provided over the gate insulating layer 506, and the conductive layer 502 is provided over the semiconductor layer 523. When the semiconductor layer 523 is provided between the conductive layer 501 and the conductive layer 502, parasitic capacitance between the conductive layer 501 and the conductive layer 502 can be reduced.

Note that the conductive layer 501 and the conductive layer 503 can be formed by processing one conductive film formed over a substrate 500 having an insulating surface into a desired shape. The semiconductor layer 507, the semiconductor layer 520, and the semiconductor layer 523 can be formed by processing one semiconductor film formed over the gate insulating layer 506 into a desired shape. The conductive layer 502 and the conductive layer 504 can be formed by processing one conductive film formed over the gate insulating layer 506, the semiconductor layer 507, the semiconductor layer 520, and the semiconductor layer 523 into a desired shape.

In addition, in the optical shutter region in FIGS. 6A and 6B, an insulating layer 512 is formed to cover the semiconductor layer 507, the semiconductor layer 520, the semiconductor layer 523, the conductive layer 502, and the conductive layer 504. Further, a conductive layer 521 is formed over the insulating layer 512 to be in contact with the conductive layer 504 through a contact hole formed in the insulating layer 512. An insulating layer 513 is formed over the conductive layer 521 and the insulating layer 512. An electrode 505 is formed over the insulating layer 513. The conductive layer 521 and the electrode 505 are in contact with each other through a contact hole formed in the insulating layer 513.

Note that although the conductive layer 504 and the electrode 505 are in contact with each other through the conductive layer 521 in the optical shutter region in FIGS. 6A and 6B, in one embodiment of the present invention, the conductive layer 504 and the electrode 505 may be in contact with each other without provision of the conductive layer 521.

A portion where the conductive layer 503 and the conductive layer 504 overlap with each other with the gate insulating layer 506 provided therebetween functions as the capacitor 108.

In FIG. 6B, a spacer 510 is formed over the electrode 505 in a portion where the conductive layer 521 and the electrode 505 overlap with each other.

FIG. 6A is a top view of the pixel provided with the spacer 510. In FIG. 6B, a substrate 514 is provided to face the substrate 500 provided with the spacer 510.

An electrode 515 is provided for the substrate 514, and a liquid crystal layer 516 containing a liquid crystal is provided between the electrode 505 and the electrode 515. A liquid crystal element 106 is formed in a portion where the electrode 505, the electrode 515, and the liquid crystal layer 516 overlap with each other.

Polarizing plates (not illustrated) are provided outside the substrate 500 and the substrate 514.

Each of the electrode 505 and the electrode 515 can be formed using a light-transmitting conductive material such as indium tin oxide containing silicon oxide (ITSO), indium tin oxide (ITO), zinc oxide (ZnO), indium zinc oxide, or zinc oxide to which gallium is added (GZO), for example.

An alignment film may be provided as appropriate between the electrode 505 and the liquid crystal layer 516 or between the electrode 515 and the liquid crystal layer 516. The alignment film can be formed using an organic resin such as polyimide or poly(vinyl alcohol). Alignment treatment for aligning liquid crystal molecules in a certain direction, such as rubbing, is performed on a surface of the alignment film. A roller wrapped with cloth of nylon or the like is rolled while being in contact with the alignment film so that the surface of the alignment film can be rubbed in a certain direction. Note that it is also possible to form the alignment film that has alignment characteristics with the use of an inorganic material such as silicon oxide by vapor deposition, without alignment treatment.

Injection of liquid crystals for formation of the liquid crystal layer 516 may be performed by a dispenser method (a dripping method) or a dipping method (a pumping method).

Note that the substrate 514 is provided with a light-blocking film 517 capable of blocking light so that disclination caused by disorder of alignment of the liquid crystal between optical shutter regions is prevented from being observed or dispersed light is prevented from entering a plurality of adjacent optical shutter regions. The light-blocking film 517 can be formed using an organic resin containing a black pigment such as a carbon black or low-valent titanium oxide. Alternatively, the light-blocking film 517 can be formed using a film including chromium.

Second Specific Example of Light-Blocking Panel 20

A specific example of the light-blocking panel 20 that is different from the specific example of the light-blocking panel 20 in FIGS. 6A and 6B is described with reference to FIGS. 7A and 7B. Specifically, an example of a light-blocking panel provided with an optical shutter region including a liquid crystal element whose pair of electrodes is formed over one substrate, such as an IPS liquid crystal element or a blue-phase liquid crystal element, is described.

Figure 7A:
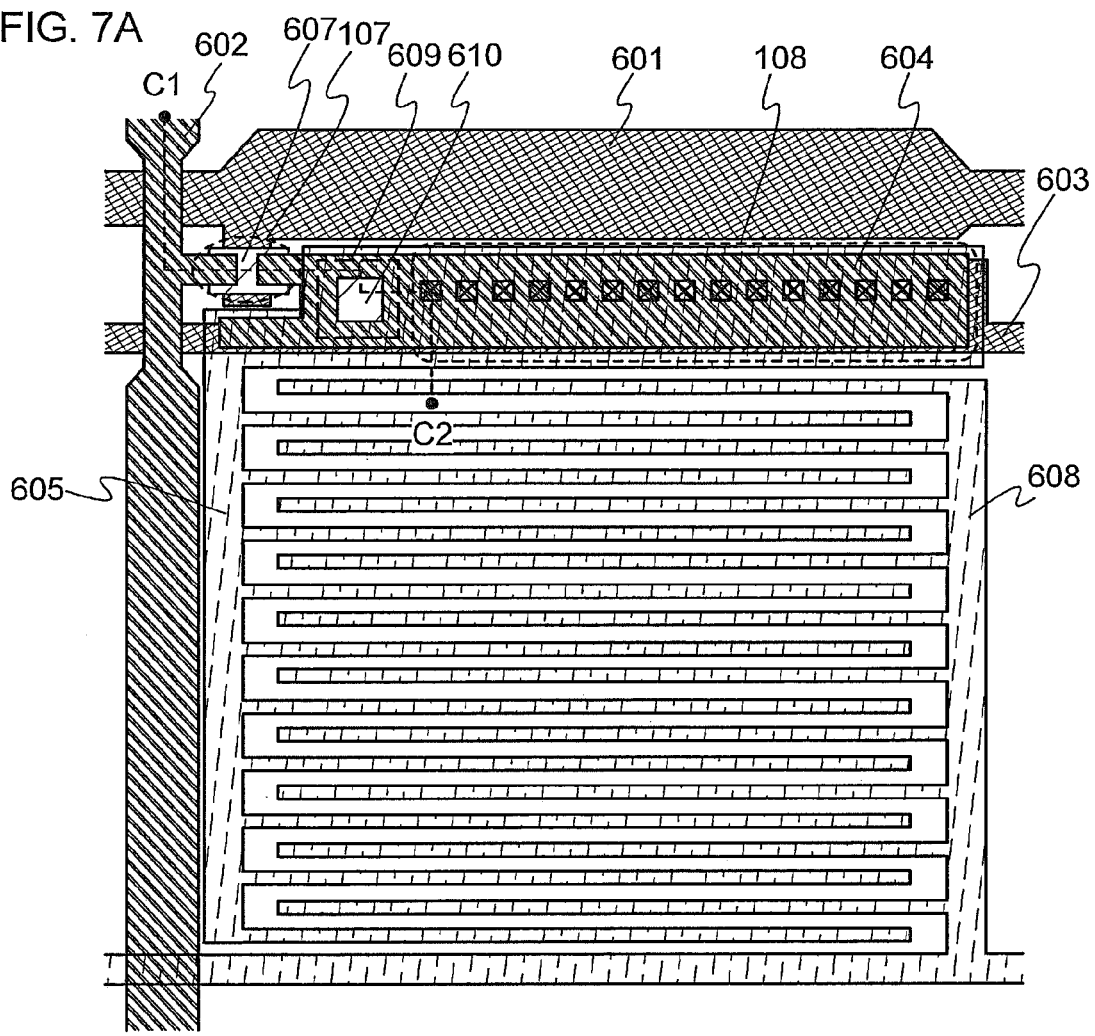
FIGS. 7A and 7B are a plan view and a cross-sectional view illustrating a specific example of an optical shutter region included in the light-blocking panel.

FIG. 7A is an example of the top view of the pixel. FIG. 7B is a cross-sectional view taken along broken line C1-C2 in FIG. 7A.

Figure 7B:
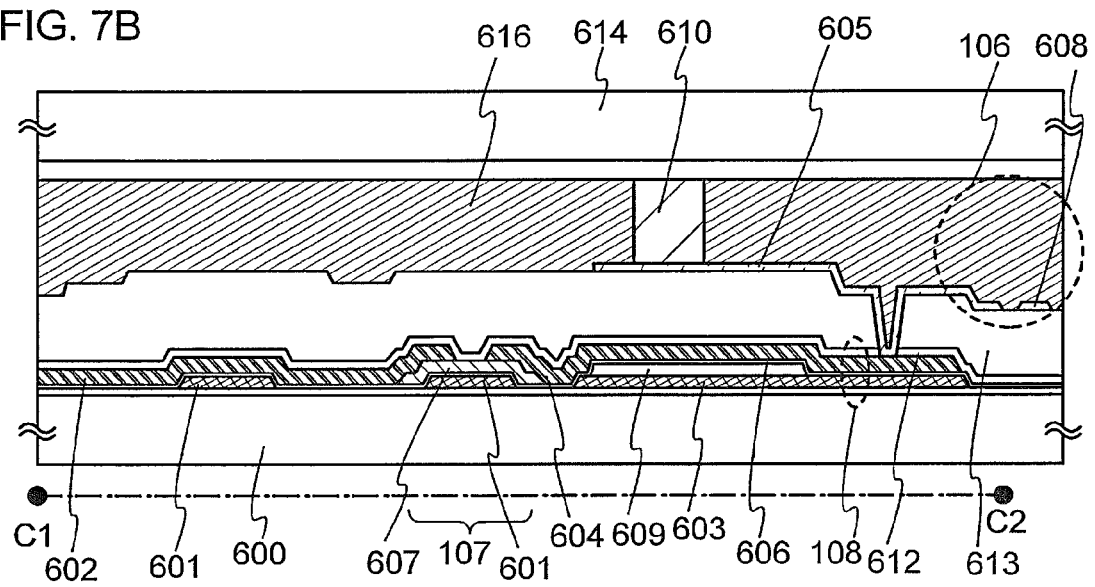

In the pixel in FIGS. 7A and 7B, a conductive layer 601 functions as the gate electrode of the transistor 107. Further, a conductive layer 602 functions as one of the source and the drain of the transistor 107. A conductive layer 603 functions as one electrode of the capacitor 108. A conductive layer 604 functions as the other of the source and the drain of the transistor 107 or the other electrode of the capacitor 108.

A gate insulating layer 606 is formed over the conductive layer 601 and the conductive layer 603. A semiconductor layer 607 of the transistor 107 is formed over the gate insulating layer 606 to overlap with the conductive layer 601. Further, an insulating layer 612 and an insulating layer 613 are sequentially formed to cover the semiconductor layer 607, the conductive layer 602, and the conductive layer 604. An electrode 605 and an electrode 608 are formed over the insulating layer 613. The conductive layer 604 and the electrode 605 are connected to each other through a contact hole formed in the insulating layer 612 and the insulating layer 613.

The conductive layer 601 and the conductive layer 603 can be formed by processing one conductive film formed over a substrate 600 having an insulating surface into a desired shape. The gate insulating layer 606 is formed over the conductive layer 601 and the conductive layer 603. The conductive layer 602 and the conductive layer 604 can be formed by processing one conductive film formed over the semiconductor layer 607 and the gate insulating layer 606 into a desired shape.

A portion where the conductive layer 603 and the conductive layer 604 overlap with each other with the gate insulating layer 606 provided therebetween functions as the capacitor 108.

In addition, in the optical shutter region in FIGS. 7A and 7B, an insulating layer 609 is formed between the conductive layer 603 and the gate insulating layer 606. Further, a spacer 610 is formed over the electrode 605 in a portion where the electrode 605 and the insulating layer 609 overlap with each other.

FIG. 7A is a top view of the optical shutter region provided with the spacer 610. In FIG. 7B, a substrate 614 is provided to face the substrate 600 provided with the spacer 610.

A liquid crystal layer 616 containing a liquid crystal is provided between the substrate 614 and the electrodes 605 and 608. The liquid crystal element 106 is formed in a region including the electrode 605, the electrode 608, and the liquid crystal layer 616.

Polarizing plates (not illustrated) are provided outside the substrate 600 and the substrate 614.

The electrode 605 and the electrode 608 can be formed using a light-transmitting conductive material such as indium tin oxide containing silicon oxide (ITSO), indium tin oxide (ITO), zinc oxide (ZnO), indium zinc oxide, or zinc oxide to which gallium is added (GZO), for example.

Injection of liquid crystals for formation of the liquid crystal layer 616 may be performed by a dispenser method (a dripping method) or a dipping method (a pumping method).

Note that the substrate 614 may be provided with a light-blocking film capable of blocking light so that disclination caused by disorder of alignment of the liquid crystal between optical shutter regions is prevented from being observed or dispersed light is prevented from entering a plurality of adjacent optical shutter regions. The light-blocking film can be formed using an organic resin containing a black pigment such as a carbon black or low-valent titanium oxide. Alternatively, the light-blocking film can be formed using a film including chromium.

Third Specific Example of Light-Blocking Panel 20

Figure 18:
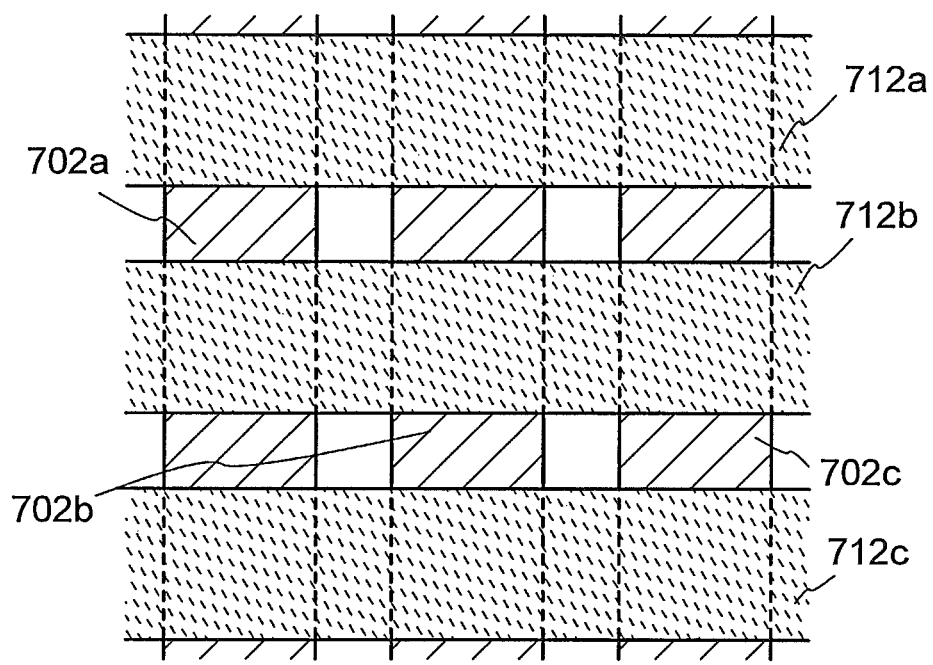
FIG. 18 illustrates a specific example of a light-blocking panel.

A specific example of the light-blocking panel 20 that is different from the specific examples of the light-blocking panel 20 in FIGS. 6A and 6B and FIGS. 7A and 7B is described with reference to FIG. 18. Specifically, an example of a light-blocking panel provided with an optical shutter region that does not include the switches included in the optical shutter regions in FIGS. 6A and 6B and FIGS. 7A and 7B is described. In the optical shutter region in FIG. 18, electrodes 702 (an electrode 702a, an electrode 702b, and an electrode 702c) processed into a stripe pattern and electrodes 712 (an electrode 712a, an electrode 712b, and an electrode 712c) processed into a stripe pattern are stacked in a lattice pattern. When the electrodes overlap with each other in a lattice pattern with a liquid crystal provided therebetween, a liquid crystal element can be formed in a dotted pattern. Thus, a light-blocking region or a light-transmitting region can be controlled with higher accuracy.

Example 1

The display device according to one embodiment of the present invention can be used for display devices, laptops, or image reproducing devices provided with recording media (typically, devices which reproduce the content of recording media such as digital versatile discs (DVDs) and have displays for displaying the reproduced images). Further, as electronic devices which can include the display device according to one embodiment of the present invention, cellular phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. In this example, specific examples of these electronic devices are described with reference to FIGS. 8A to 8C.

Figure 8A:
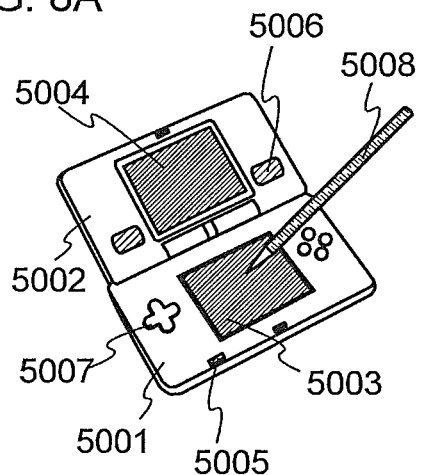
FIGS. 8A to 8C illustrate specific examples of electronic devices.

FIG. 8A illustrates a portable game machine, which includes a housing 5001, a housing 5002, a display portion 5003, a display portion 5004, a microphone 5005, speakers 5006, an operation key 5007, a stylus 5008, and the like. The display device according to one embodiment of the present invention can be used as the display portion 5003 or the display portion 5004. It is possible to provide a portable game machine capable of displaying a partial 3D image when the display device according to one embodiment of the present invention is used as the display portion 5003 or the display portion 5004. Note that although the portable game machine in FIG. 8A has the two display portions 5003 and 5004, the number of display portions included in the portable game machine is not limited thereto.

Figure 8B:
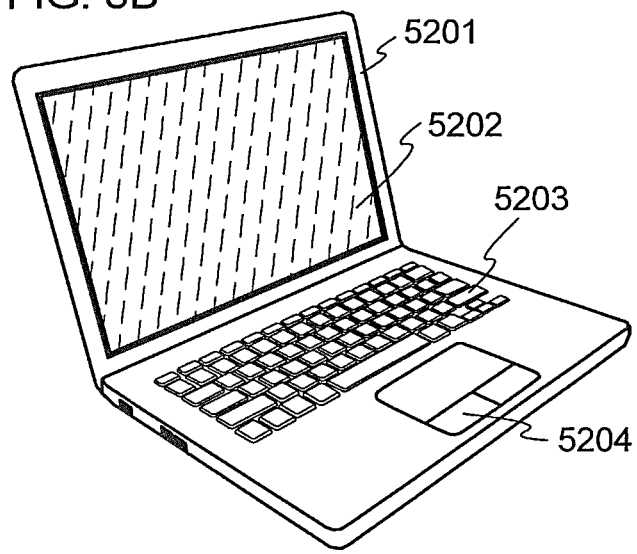

FIG. 8B illustrates a laptop, which includes a housing 5201, a display portion 5202, a keyboard 5203, a pointing device 5204, and the like. The display device according to one embodiment of the present invention can be used as the display portion 5202. It is possible to provide a laptop capable of displaying a partial 3D image when the display device according to one embodiment of the present invention is used as the display portion 5202.

Figure 8C:
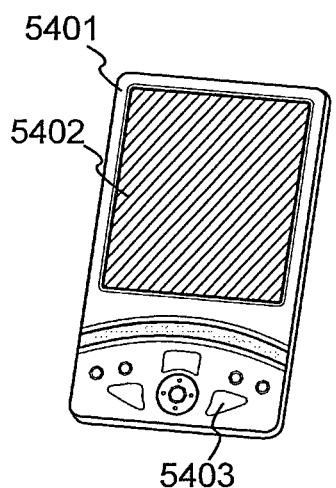

FIG. 8C illustrates a personal digital assistant, which includes a housing 5401, a display portion 5402, operation keys 5403, and the like. The display device according to one embodiment of the present invention can be used as the display portion 5402. It is possible to provide a personal digital assistant capable of displaying a partial 3D image when the display device according to one embodiment of the present invention is used as the display portion 5402.

Example 2

The display device according to one embodiment of the present invention can display both a 3D image and a 2D image when drive is controlled in each of the plurality of pixel regions 100 included in the display panel 10 and in each of the optical shutter regions 200 included in the light-blocking panel 20. Here, drive frequency needed for the display panel 10 and drive frequency needed for the light-blocking panel 20 are different from each other. In other words, the display panel 10 needs to be constantly driven in order to display a moving image, and the light-blocking panel 20 needs to be regularly or irregularly driven in accordance with switching of 3D display and 2D display. In that case, a period during which the light-blocking panel 20 needs to be driven is much shorter than a period during which the light-blocking panel 20 is kept in a certain state. In this example, operation to drive the light-blocking panel 20 only in a desired period and to keep the light-blocking panel 20 in a certain state in periods other than the period and a structure that is suitable for the operation are described with reference to FIGS. 9A to 9D. Note that by the operation, the power consumption of the display device can be reduced.

Figure 9A:
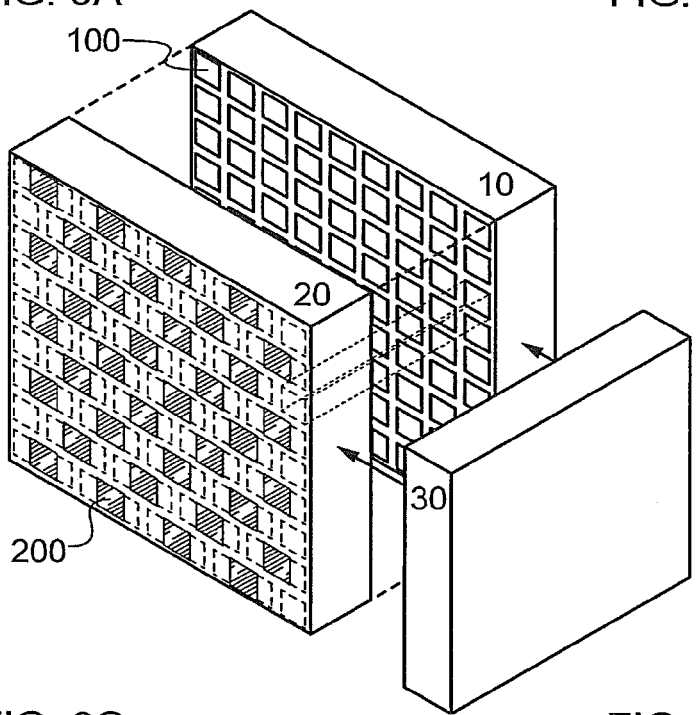
FIG. 9A illustrates a structure example of the display device.

FIG. 9A illustrates a structure example of the display device in this example. The display device in FIG. 9A includes the display panel 10 including the plurality of pixel regions 100 arranged in matrix, the light-blocking panel 20 including the plurality of optical shutter regions 200 arranged in matrix, and a controller 30 for controlling the operation of the display panel 10 and the light-blocking panel 20. Note that a display panel or the like that includes the pixel regions in FIGS. 4A to 4C and FIGS. 5A and 5B can be used as the display panel 10, and a light-blocking panel or the like that includes the optical shutter regions in FIGS. 6A and 6B and FIGS. 7A and 7B can be used as the light-blocking panel 20. Further, the controller 30 has a function of controlling display of a 3D or 2D moving image in the display panel 10 and a function of driving the light-blocking panel 20 only in a desired period and keeping the state of the light-blocking panel 20 in periods other than the period.

Figure 9B:
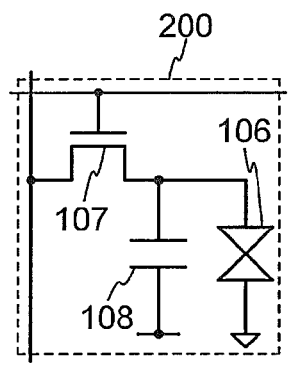
FIG. 9B is an equivalent circuit diagram of the optical shutter region in FIGS. 6A and 6B and FIGS. 7A and 7B, and FIGS. 9C and 9D are flow charts illustrating an operation example of a controller.

FIG. 9B is an equivalent circuit diagram of the optical shutter region 200 included in the light-blocking panel 20 in FIGS. 6A and 6B and FIGS. 7A and 7B. Specifically, the optical shutter region 200 in FIG. 9B includes the transistor 107, the liquid crystal element 106 to which a signal is input through the transistor 107, and the capacitor 108 for holding the potential of the signal. In the optical shutter region 200, whether to transmit light is selected by control of alignment of a liquid crystal of the liquid crystal element in accordance with the potential of the signal. Thus, in order to perform the above operation, it is necessary to hold the potential of the signal for a long time. In order to meet the need, a channel region of the transistor 107 is preferably formed using an oxide semiconductor. This is because leakage of electric charge through the transistor 107 can be reduced, so that a fluctuation in the potential of the signal can be suppressed.

An oxide semiconductor has a wider band gap and lower intrinsic carrier density than silicon. Thus, with the use of an oxide semiconductor for the semiconductor layer of the transistor 107, a transistor that has much lower off-state current than a transistor including a normal semiconductor such as silicon or germanium can be formed.

Note that a highly-purified oxide semiconductor (a purified oxide semiconductor) obtained by reduction of impurities such as moisture or hydrogen which serve as electron donors (donors) is an intrinsic (i-type) semiconductor or a substantially intrinsic semiconductor. Thus, a transistor including the oxide semiconductor has extremely low off-state current. Specifically, the concentration of hydrogen in the highly-purified oxide semiconductor that is measured by secondary ion mass spectroscopy (SIMS) is $5\times10^{19}/cm^3$ or lower, preferably $5\times10^{18}/cm^3$ or lower, more preferably $5\times10^{17}/cm^3$ or lower, still more preferably $1\times10^{16}/cm^3$ or lower. In addition, the carrier density of the oxide semiconductor that can be measured by Hall effect measurement is lower than $1\times10^{14}/cm^3$, preferably lower than $1\times10^{12}/cm^3$, more preferably lower than $1\times10^{11}/cm^3$. Further, the band gap of the oxide semiconductor is 2 eV or more, preferably 2.5 eV or more, more preferably 3 eV or more. With the use of an oxide semiconductor film which is highly purified by a sufficient decrease in the concentration of impurities such as moisture or hydrogen, the off-state current value of the transistor can be decreased. Various experiments can prove the low off-state current of the transistor including the highly-purified oxide semiconductor film as an active layer. For example, even with an element with a channel width of $1\times10^6$ μm and a channel length of 10 μm, in a range of 1 to 10 V of voltage (drain voltage) between a source terminal and a drain terminal, off-state current can be lower than or equal to the measurement limit of a semiconductor parameter analyzer, that is, lower than or equal to $1\times10^{-13}$ A. In that case, it can be seen that off-state current density corresponding to a value obtained by division of the off-state current by the channel width of the transistor is lower than or equal to 100 zM/μm.

The analysis of the concentration of hydrogen in the oxide semiconductor film is described here. The concentration of hydrogen in the semiconductor film and the conductive film is measured by secondary ion mass spectroscopy (SIMS). It is known that it is difficult to obtain precise data in the vicinity of a surface of a sample or in the vicinity of an interface between stacked films formed using different materials by a SIMS analysis in principle. Thus, in the case where the distribution of the concentration of hydrogen in the film in a thickness direction is analyzed by SIMS, an average value in a region of the film in which the value is not greatly changed and substantially the same value can be obtained is employed as the hydrogen concentration. In addition, in the case where the thickness of the film is small, a region where substantially the same value can be obtained cannot be found in some cases due to the influence of the hydrogen concentration of the films adjacent to each other. In that case, the maximum value or the minimum value of the hydrogen concentration in the region of the film is employed as the hydrogen concentration of the film. Further, in the case where a mountain-shaped peak having the maximum value or a valley-shaped peak having the minimum value do not exist in the region of the film, the value at an inflection point is employed as the hydrogen concentration.

Note that a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor; a Sn—O-based oxide semiconductor; a Zn—O-based oxide semiconductor; or the like can be used as the oxide semiconductor. In this specification, for example, an In—Sn—Ga—Zn—O-based oxide semiconductor is a metal oxide containing indium (In), tin (Sn), gallium (Ga), and zinc (Zn), and there is no particular limitation on the stoichiometric proportion thereof. The oxide semiconductor may contain silicon.

The oxide semiconductor can be represented by a chemical formula, $InMO_3(ZnO)_m$ (m>0, m is not necessarily a natural number). Here, M represents one or more metal elements selected from Ga, Al, Mn, or Co.

In the case where an In—Zn—O-based material is used for the oxide semiconductor, a target used has a composition ratio of In:Zn=50:1 to 1:2 in an atomic ratio ($In_2O_3$: ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, when a target used for deposition of an In—Zn—O-based oxide semiconductor has a composition ratio of In:Zn:O=X: Y:Z in an atomic ratio, where Z>1.5X+Y.

Note that the oxide semiconductor may be either amorphous or crystalline. For example, a CAAC-OS (c-axis aligned crystalline oxide semiconductor) film can be used as the oxide semiconductor film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between the amorphous part and a crystal part in the CAAC-oxide semiconductor film is not clear. Further, with the TEM, a grain boundary in the CAAC-oxide semiconductor film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

In the CAAC-OS film, distribution of crystal parts is not necessarily uniform. For example, in the formation process of the CAAC-OS film, in the case where an oxide semiconductor film is formed on one surface and crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal direction (vector) of the surface where the CAAC-OS film is formed or a normal direction (vector) of the surface of the CAAC-OS film. The crystal part is formed by deposition or by performing treatment for crystallization such as heat treatment after deposition.

With use of the CAAC-OS film in a transistor, a change in electrical characteristics of the transistor due to irradiation with visible light or ultraviolet light can be reduced. Thus, the transistor has high reliability.

Figure 9C:
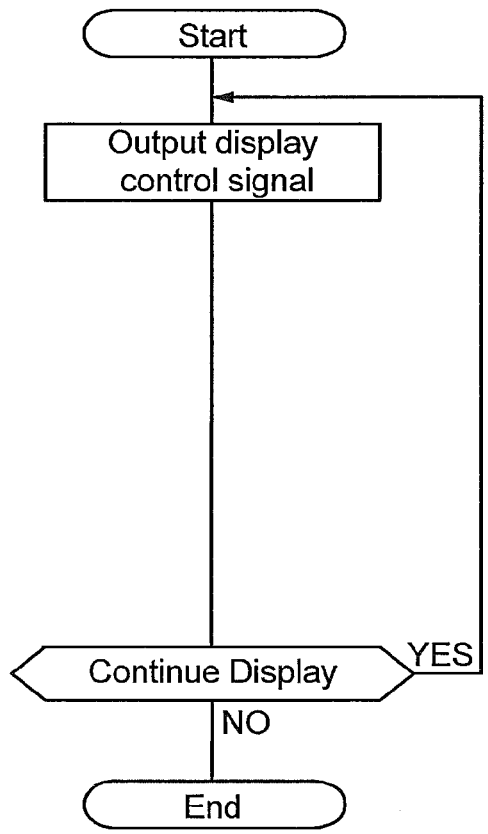
Figure 9D:
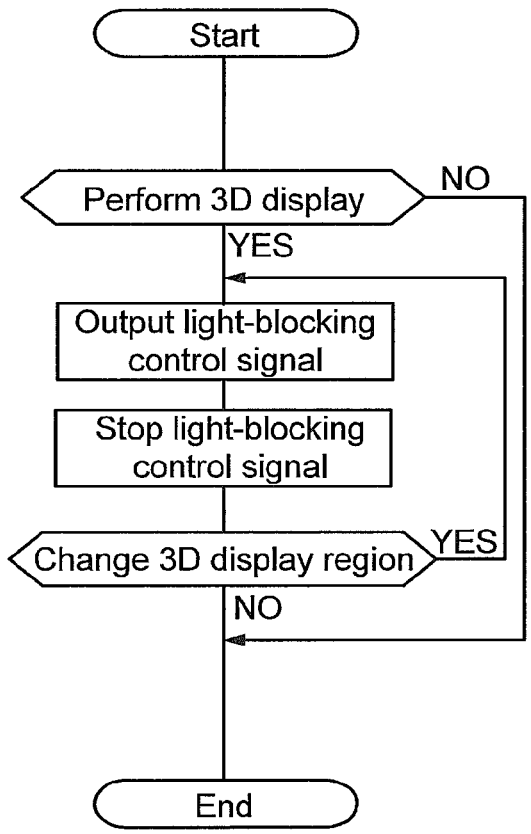

FIGS. 9C and 9D are flow charts each illustrating an operation example of the controller 30 in FIG. 9A. Specifically, FIG. 9C is a flow chart illustrating an operation example of the controller 30 for controlling the display panel 10, and FIG. 9D is a flow chart illustrating an operation example of the controller 30 for controlling the light-blocking panel 20.

After the controller 30 starts to operate, a display control signal is output to the display panel 10. Here, the display control signal is an image signal input to each of the plurality of pixel regions 100 arranged in matrix, a signal (e.g., a clock signal) for controlling operation, or the like. The display control signal is constantly supplied to the display panel 10 as long as the controller 30 continues display in the display panel 10.

Further, in the case where the controller 30 operates and 3D display is performed in part or the whole of display in the display device, the controller 30 outputs a light-blocking control signal to the light-blocking panel 20. Here, the light-blocking control signal is a control signal (a signal for determining whether to block light) input to each of the plurality of optical shutter regions 200 arranged in matrix, a signal (e.g., a clock signal) for controlling operation, or the like. After control signals are supplied to the plurality of optical shutter regions 200, supply of light-blocking control signals is stopped. Note that in the case where a region in which 3D display is performed is changed, the controller 30 outputs a light-blocking control signal to the light-blocking panel 20 again. In this manner, the light-blocking control signal is regularly or irregularly supplied to the light-blocking panel 20 when 3D display is performed or a region in which 3D display is performed is changed.

Note that in the flow chart in FIG. 9D, in the case where the light-blocking control signal is not supplied to the light-blocking panel 20 for a long time, a light-blocking control signal for performing 3D display in one region can be supplied (refreshed) to the light-blocking panel 20 again. In other words, in the case where 3D display is performed in a specific region of the display device for a long time, a light-blocking control signal for performing 3D display can be supplied to the light-blocking panel 20 as appropriate (regularly or irregularly) in the specific region.

By the operation in this example, it is not necessary to constantly drive the light-blocking panel 20; thus, the power consumption of the display device can be reduced.

Example 3

Note that in order to display a 3D image as described above, it is necessary that the plurality of optical shutter regions be different in positional relation between the optical shutter region and the corresponding two pixel regions or that the positional relation between an optical shutter region included in a specific region and corresponding two pixel regions be different from the positional relation between an optical shutter region included in a region other than the specific region and corresponding two pixel regions, though the positional relation between the optical shutter region included in the specific region and the corresponding two pixel regions is common In this example, how these positional relations are different in the display device is described giving a specific example.

Figure 10:
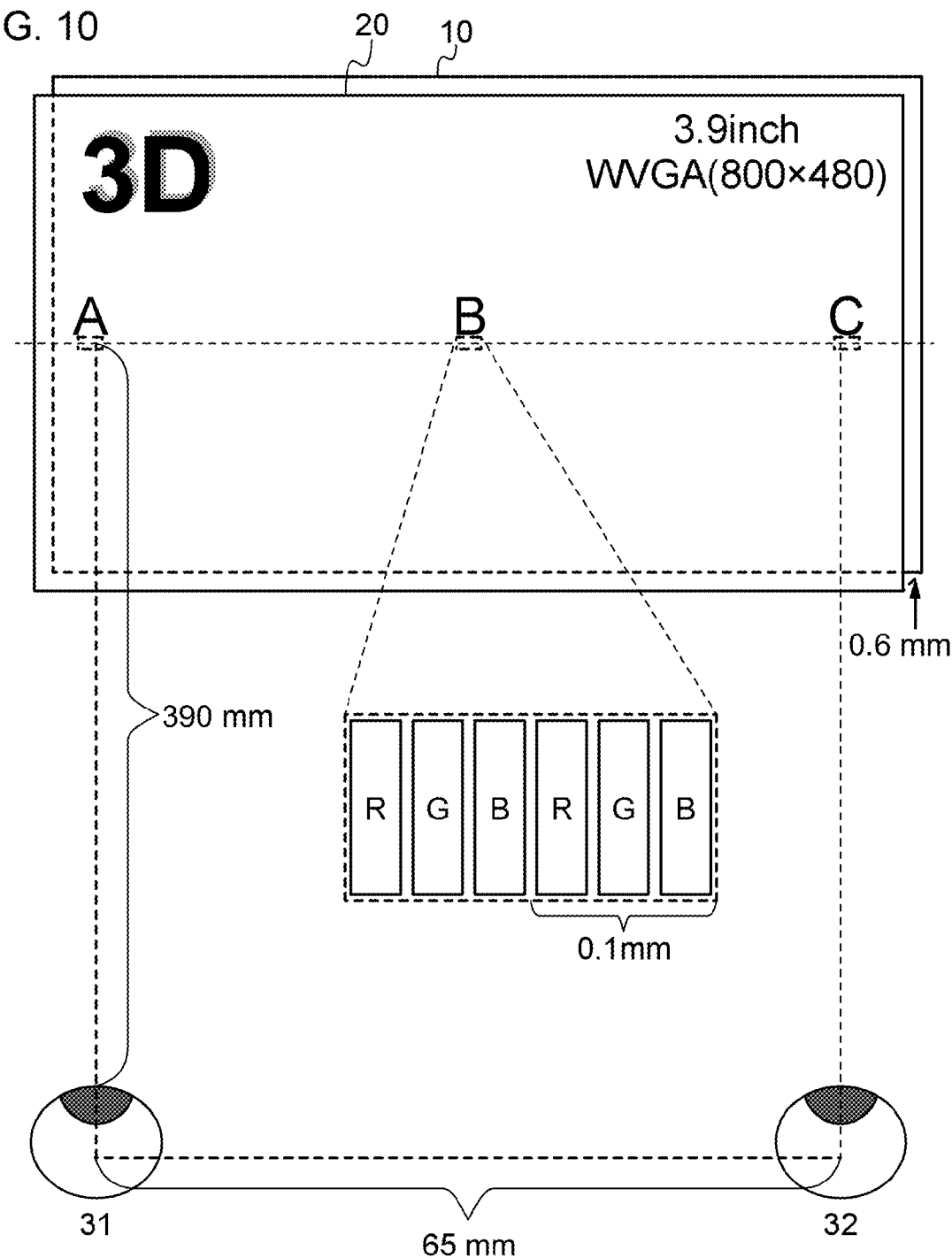
FIG. 10 illustrates the structure of a display device in Example 3.

FIG. 10 illustrates the structure of the display device in this example. The display device in FIG. 10 includes the 3.9-inch display panel 10 whose pixel resolution is WVGA (800×480) and the light-blocking panel 20 provided in a direction in which the display panel 10 emits light. Note that an interval between a plane on which the plurality of pixel regions included in the display panel 10 are provided and a plane on which the plurality of optical shutter regions included in the light-blocking panel 20 are provided is 0.6 mm. Further, each pixel region includes a red pixel (R), a green pixel (G), and a blue pixel (B). The width of each pixel region in a lateral direction (a direction in which a parallax between a left eye and a right eye exists) is 0.1 mm. Furthermore, the display device is designed so that a user whose interval between both eyes is 65 mm can view a 3D image when the user is 390 mm away from the display device. Note that in FIG. 10, A indicates the positions of two pixel regions provided in front of the left eye 31, B indicates the positions of two pixel regions provided between the left eye 31 and the right eye 32, and C indicates the positions of two pixel regions provided in front of the right eye 32. Here, a pixel region positioned in a column at an end of the pixel is placed in front of the left eye 31 or the right eye 32. In the following description, the display device displays a 3D image across the front of the screen.

Figure 11A:
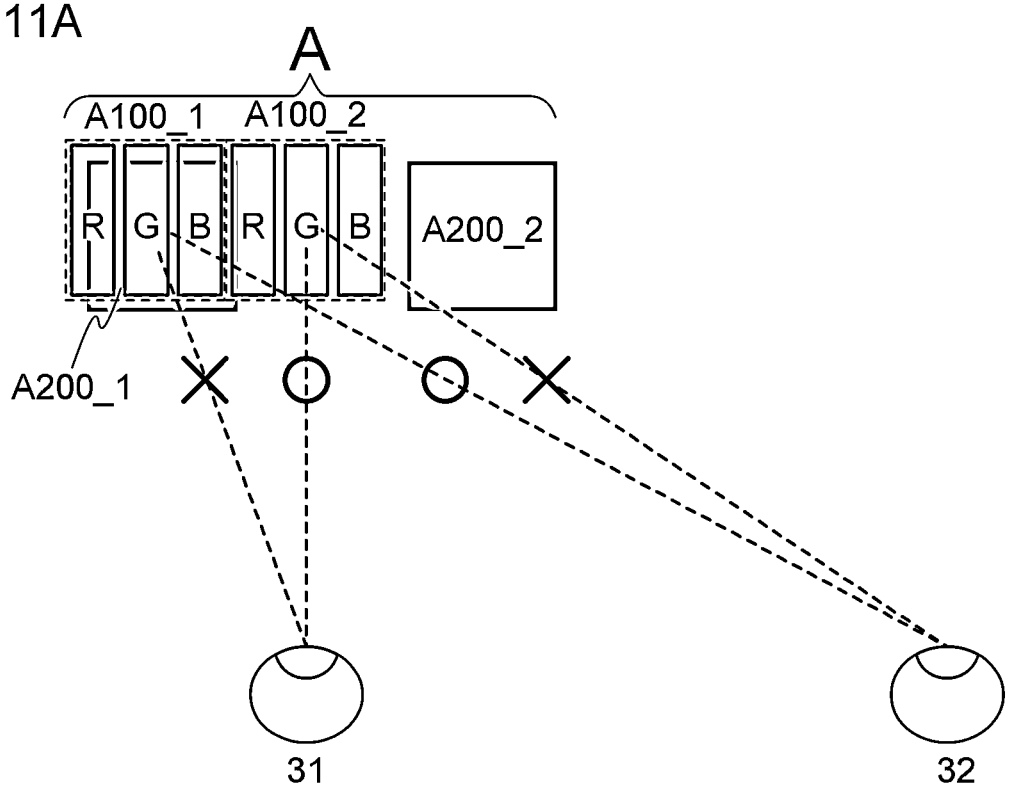
FIGS. 11A and 11B illustrate a positional relation between an optical shutter region and a pixel region in Example 3.
Figure 11B:
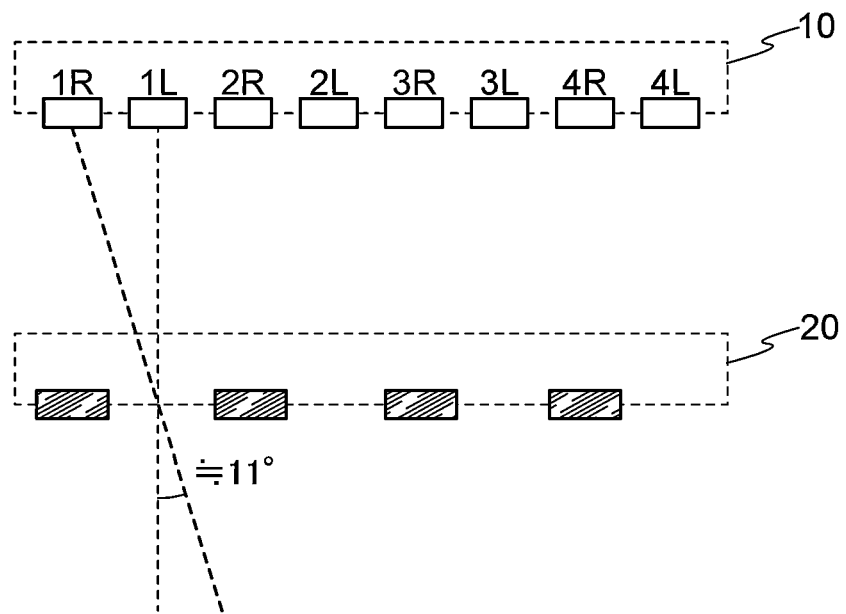

FIG. 11A illustrates the positional relation between two pixel regions A100_1 and A100_2 positioned in front of the left eye 31 and optical shutter regions A200_1 and A200_2 positioned in front of the pixel regions A100_1 and A100_2. Here, the pixel region A100_1 is viewed by the right eye 32, but is not viewed by the left eye 31 because it is blocked by the optical shutter region A200_1. In addition, the pixel region A100_2 is viewed by the left eye 31, but is not viewed by the right eye 32 because it is blocked by the optical shutter region A200_2. FIG. 11B illustrates an angle formed by the direction of the right eye 32 and the vertical line of the display panel 10 under the above condition. Under the condition, the angle is approximately 11°. Note that in FIG. 11B, 1R indicates one of pixel regions in a first column where a 3D image for the right eye is displayed, 1L indicates one of pixel regions in the first column where a 3D image for the left eye is displayed, 2R to 4R indicate pixel regions in second to fourth columns where 3D images for the right eye are displayed, and 2L to 4L indicate pixel regions in the second to fourth columns where 3D images for the left eye are displayed.

Figure 12A:
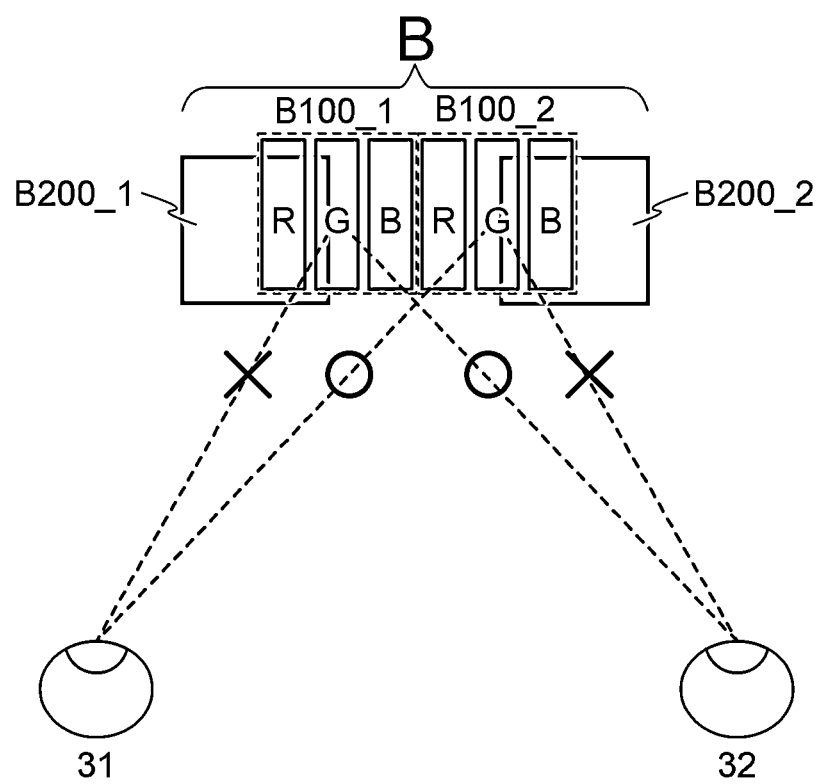
FIGS. 12A and 12B illustrate a positional relation between an optical shutter region and a pixel region in Example 3.
Figure 12B:
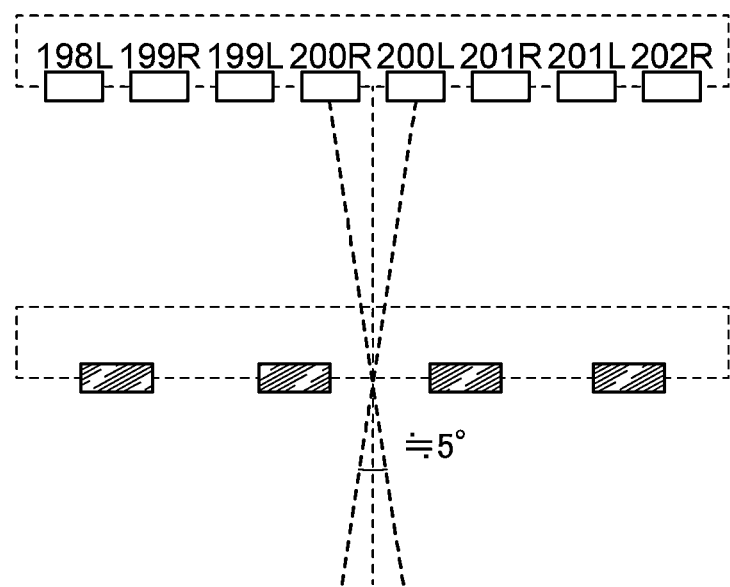

FIG. 12A illustrates the positional relation between two pixel regions B100_1 and B100_2 positioned between the left eye 31 and the right eye 32 and optical shutter regions B200_1 and B200_2 positioned in front of the pixel regions B100_1 and B100_2. Here, the pixel region B100_1 is viewed by the right eye 32, but is not viewed by the left eye 31 because it is blocked by the optical shutter region B200_1. In addition, the pixel region B100_2 is viewed by the left eye 31, but is not viewed by the right eye 32 because it is blocked by the optical shutter region B200_2. FIG. 12B illustrates an angle formed by the direction of the right eye 32 and the vertical line of the display panel 10 under the above condition. Under the condition, the angle is approximately 5°. Note that in FIG. 12B, 199R to 202R and 198L to 201L are similar to 1R to 4R and 1L to 4L in FIG. 11A, respectively.

Figure 13A:
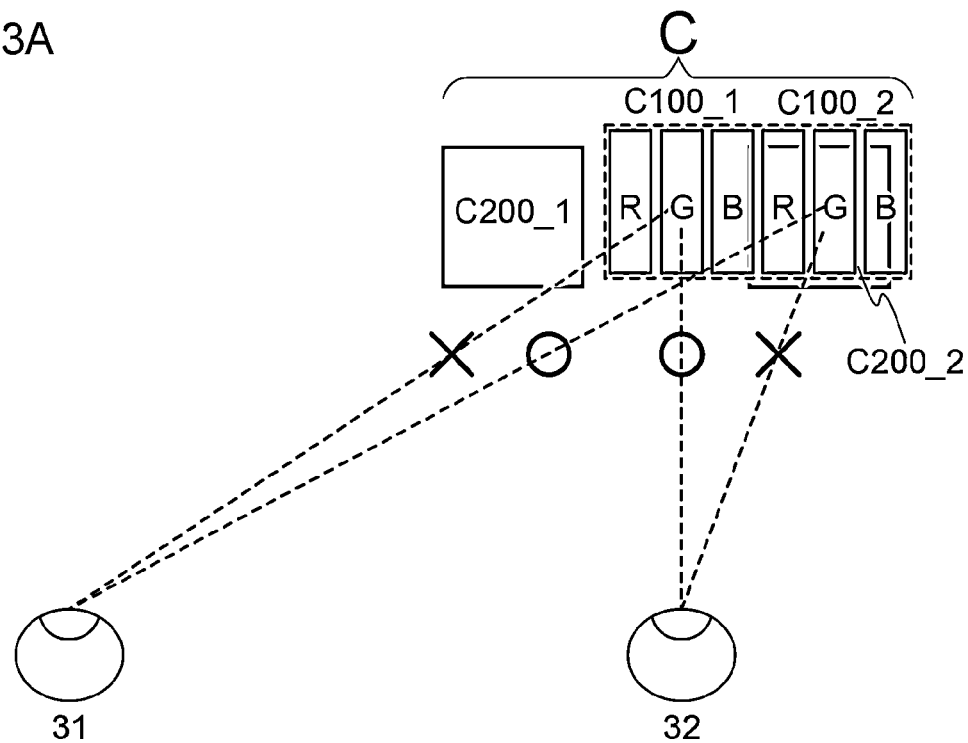
FIGS. 13A and 13B illustrate a positional relation between an optical shutter region and a pixel region in Example 3.
Figure 13B:
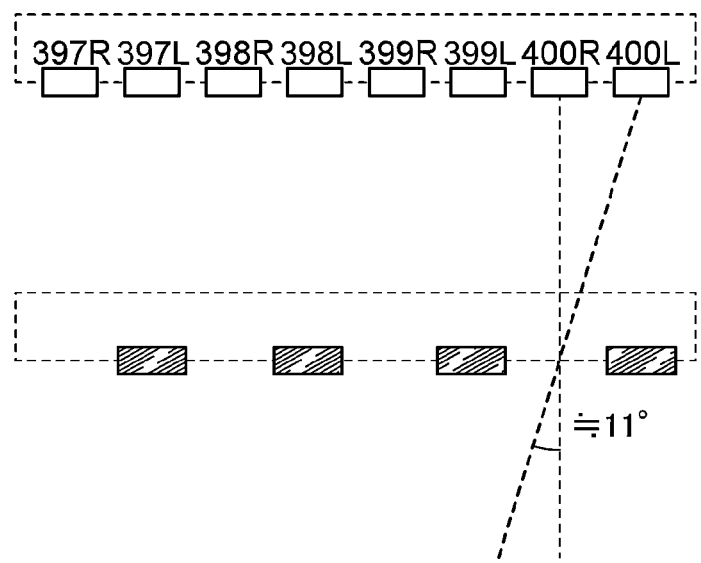

FIG. 13A illustrates the positional relation between two pixel regions C100_1 and C100_2 positioned in front of the right eye 32 and optical shutter regions C200_1 and C200_2 positioned in front of the pixel regions C100_1 and C100_2. Here, the pixel region C100_1 is viewed by the right eye 32, but is not viewed by the left eye 31 because it is blocked by the optical shutter region C200_1. In addition, the pixel region C100_2 is viewed by the left eye 31, but is not viewed by the right eye 32 because it is blocked by the optical shutter region C200_2. FIG. 13B illustrates an angle formed by the direction of the left eye 31 and the vertical line of the display panel 10 under the above condition. Under the condition, the angle is approximately 11°. Note that in FIG. 12B, 397R to 400R and to 400L are similar to 1R to 4R and 1L to 4L in FIG. 11A, respectively.

Example 4

In the display device, it is assumed that the direction of the user's eye is positioned in the center of the screen; however, the direction of the user's eye is not necessarily positioned in the center of the screen. Further, even when 3D images are displayed in two regions of the screen, the user does not necessarily focus on the images at the same time. In this example, a display device for selecting a region in which a 3D image is displayed in accordance with the direction of the user's eye is specifically described.

FIG. 14 illustrates a display device in this example. The display device in FIG. 14 includes a screen 1000 on which 3D images are displayed in a region 1001 and a region 1002 and 2D images are displayed in regions other than the region 1001 and the region 1002, and a viewer sensor 2000 capable of detecting the direction of the user's eye that is positioned around the screen 1000. Further, the display device can control the operation of a plurality of optical shutter regions included in a light-blocking panel in accordance with the direction of the user's eye.

Figure 15:
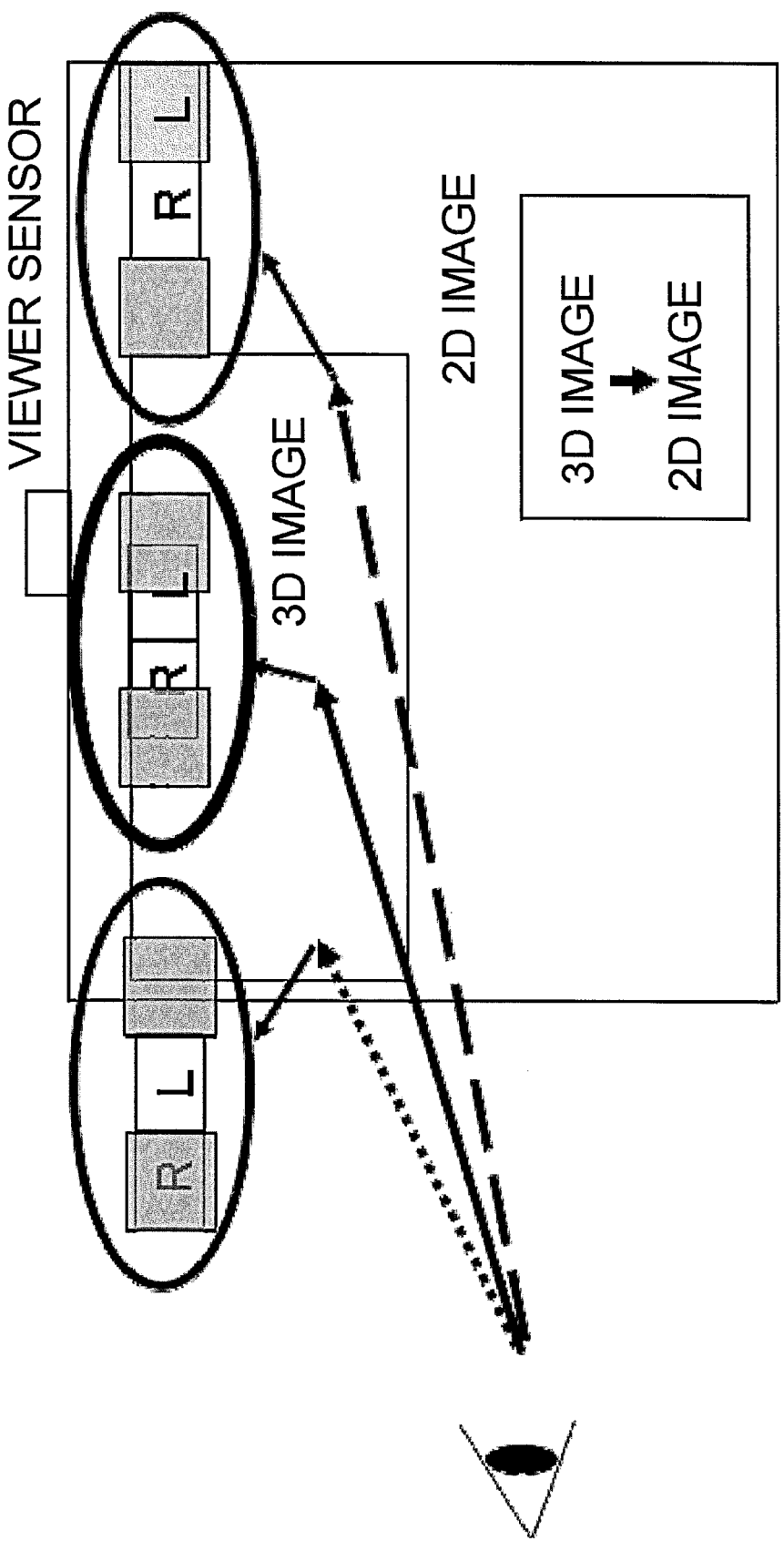
FIG. 15 illustrates the display device in Example 4.
Figure 16:
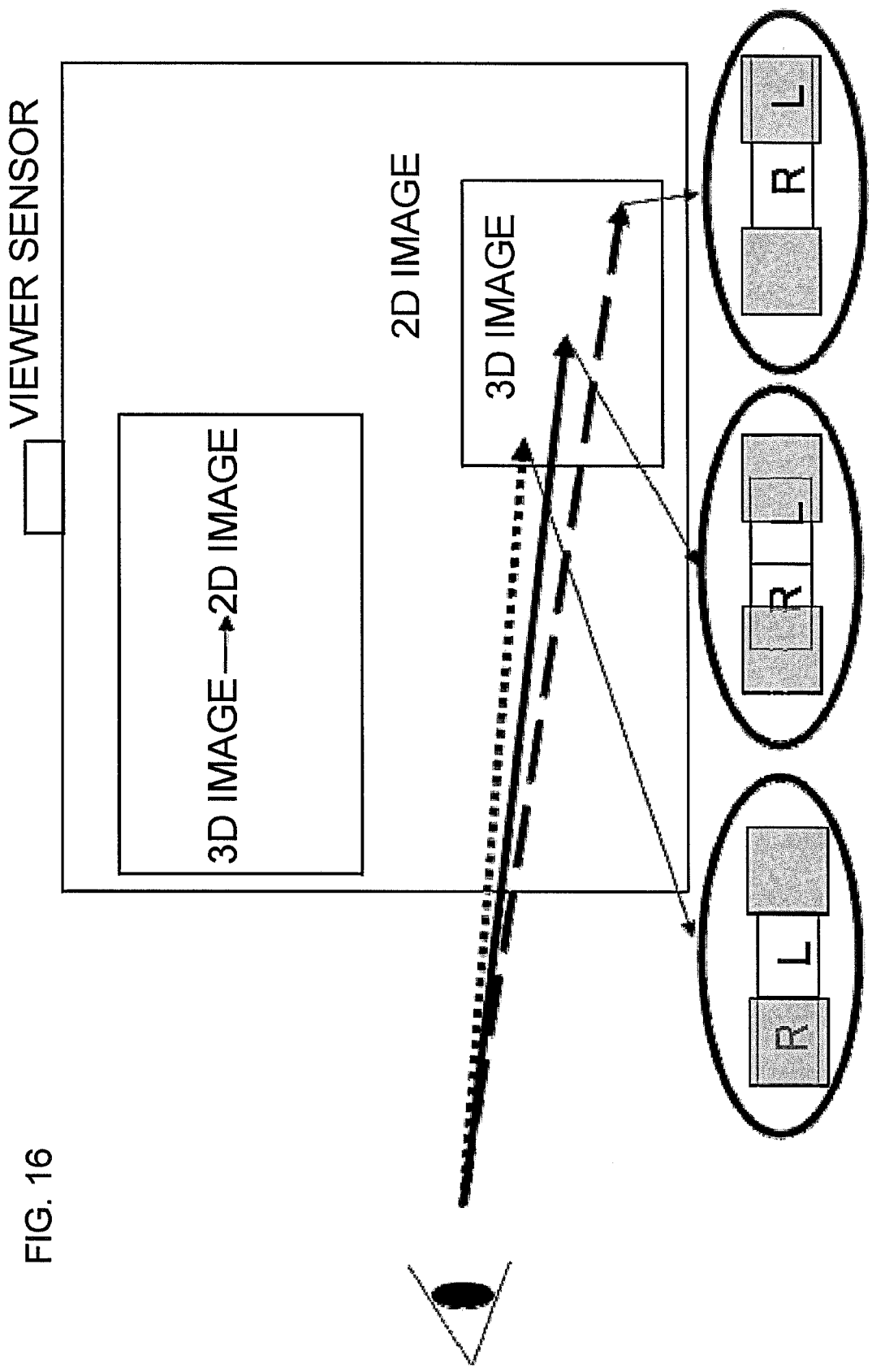
FIG. 16 illustrates the display device in Example 4.

Specifically, when the viewer sensor 2000 decides that the user sees a 3D image in the region 1001, the display device controls the operation so that light is blocked in the plurality of optical shutter regions that corresponds to the region 1001 among the plurality of optical shutter regions included in the light-blocking panel. Further, when viewer sensor 2000 decides that the user cannot sees a 3D image in the region 1002, a 3D image is not displayed in the region 1002. In other words, the display device controls the operation so that light is transmitted in the plurality of optical shutter regions that correspond to the region 1002 among the plurality of optical shutter regions included in the light-blocking panel (see FIG. 15). Note that in FIG. 15, R indicates a pixel region where a 3D image for the right eye is displayed, L indicates a pixel region where a 3D image for the left eye is displayed, and a gray portion indicates an optical shutter region where light is blocked (the same can be said for FIG. 16 and FIG. 17).

Similarly, when the viewer sensor 2000 decides that the user sees a 3D image in the region 1002, the display device controls the operation so that light is blocked in the plurality of optical shutter regions that corresponds to the region 1002 among the plurality of optical shutter regions included in the light-blocking panel. Further, when viewer sensor 2000 decides that the user cannot sees a 3D image in the region 1001, a 3D image is not displayed in the region 1001. In other words, the display device controls the operation so that light is transmitted in the plurality of optical shutter regions that correspond to the region 1001 among the plurality of optical shutter regions included in the light-blocking panel (see FIG. 16).

Figure 17:
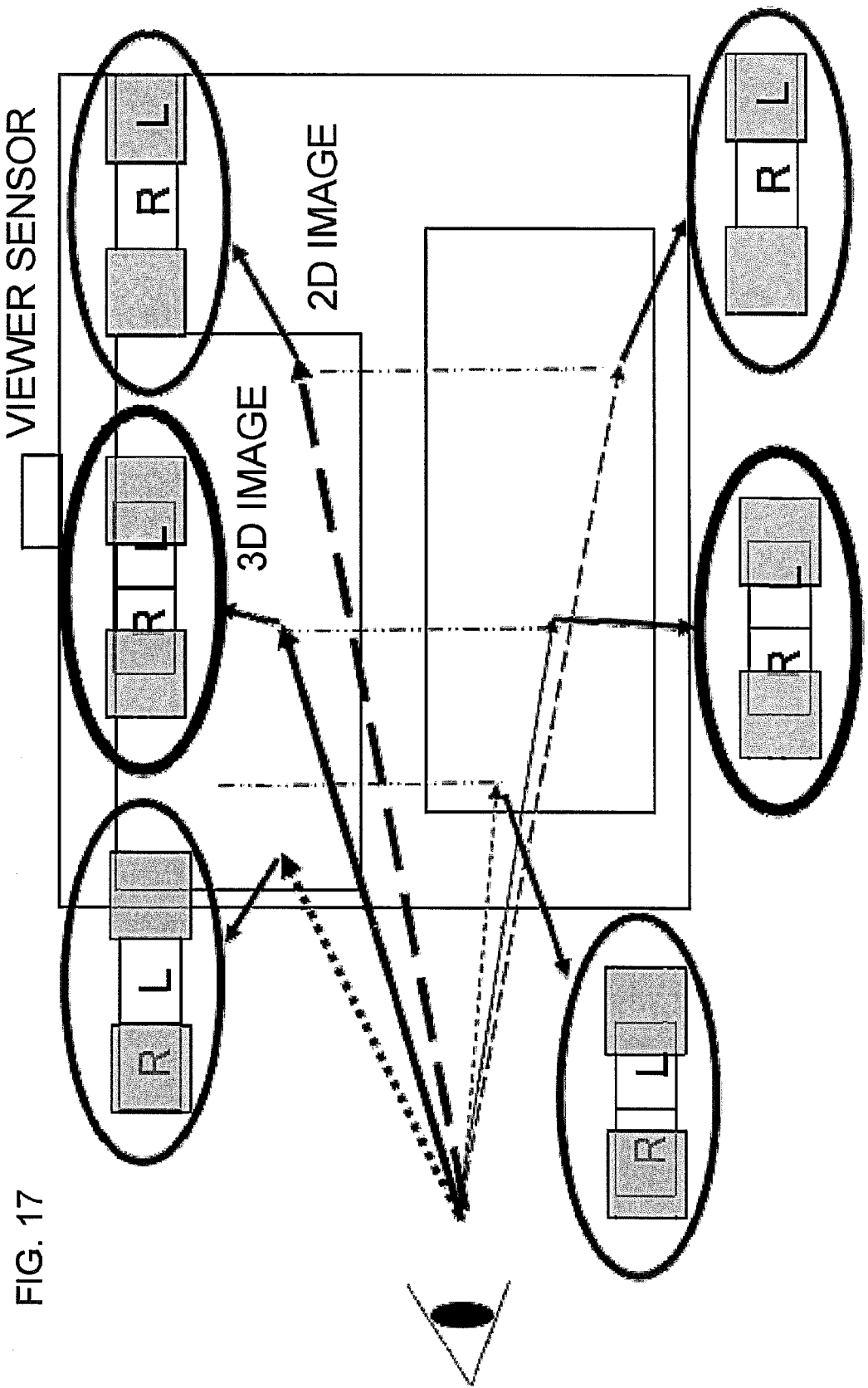
FIG. 17 illustrates the display device in Example 4.

Further, when the viewer sensor 2000 decides that the user can see 3D images both in the region 1001 and the region 1002, the display device controls the operation so that light is blocked in the plurality of optical shutter regions that correspond to the region 1001 and the region 1002 among the plurality of optical shutter regions included in the light-blocking panel (see FIG. 17).

When the operation of the plurality of optical shutter regions included in the light-blocking panel is controlled in consideration of the direction of the user's eye in this manner, an optimal barrier for 3D display can be formed.

EXPLANATION OF REFERENCES

10: display panel, 20: light-blocking panel, 20*a*: region, 30: controller, 31: left eye, 32: right eye, 100: pixel region, 100*a*: pixel region, 100*b*: pixel region, 100*c*: pixel region, 100*d*: pixel region, 106: liquid crystal element, 107: transistor, 108: capacitor, 200: optical shutter region, 200*a*: optical shutter region, 200*b*: optical shutter region, 201: substrate, 202: gate electrode layer, 204: gate insulating layer, 206: semiconductor layer, 208: drain electrode layer, 210: insulating layer, 212: insulating layer, 214: reflective electrode layer, 216: partition, 218: light-emitting layer, 219: transflective electrode layer, 220*a*: transparent electrode layer, 220*b*: transparent electrode layer, 230: transistor, 240*a*: blue pixel, 240*b*: green pixel, 240*c*: red pixel, 251: substrate, 252: light-blocking film, 254: color filter, 256: overcoat, 260: space, 300: substrate, 310: insulating layer, 312: partition, 314: electrode, 316: light-emitting layer, 318: electrode, 320: light-emitting element, 322: space, 330: transistor, 350: substrate, 352: light-blocking film, 354: color filter, 356: overcoat, 500: substrate, 501: conductive layer, 502: conductive layer, 503: conductive layer, 504: conductive layer, 505: electrode, 506: gate insulating layer, 507: semiconductor layer, 510: spacer, 512: insulating layer, 513: insulating layer, 514: substrate, 515: electrode, 516: liquid crystal layer, 517: light-blocking film, 520: semiconductor layer, 521: conductive layer, 523: semiconductor layer, 600: substrate, 601: conductive layer, 602: conductive layer, 603: conductive layer, 604: conductive layer, 605: electrode, 606: gate insulating layer, 607: semiconductor layer, 608: electrode, 609: insulating layer, 610: spacer, 612: insulating layer, 613: insulating layer, 614: substrate, 616: liquid crystal layer, 702: electrode, 702*a*: electrode, 702*b*: electrode, 702*c*: electrode, 712: electrode, 712*a*: electrode, 712*b*: electrode, 712*c*: electrode, 1000: screen, 1001: region, 1002: region, 2000: viewer sensor, 5001: housing, 5002: housing, 5003: display portion, 5004: display portion, 5005: microphone, 5006: speaker, 5007: operation key, 5008: stylus, 5201: housing, 5202: display portion, 5203: keyboard, 5204: pointing device, 5401: housing, 5402: display portion, 5403: operation key, A100_1: pixel region, A100_2: pixel region, A200_1: optical shutter region, A200_2: optical shutter region, B100_1: pixel region, B100_2: pixel region, B200_1: optical shutter region, B200_2: optical shutter region, C100_1: pixel region, C100_2: pixel region, C200_1: optical shutter region, and C200_2: optical shutter region.

This application is based on Japanese Patent Application serial No. 2011-029203 filed with Japan Patent Office on Feb. 14, 2011, Japanese Patent Application serial No. 2011-030566 filed with Japan Patent Office on Feb. 16, 2011, and Japanese Patent Application serial No. 2011-133336 filed with Japan Patent Office on Jun. 15, 2011, the entire contents of which are hereby incorporated by reference.

The invention claimed is:

1. A display device comprising:
a display panel comprising pixel regions; and
a light-blocking panel comprising optical shutter regions each comprising:
a transistor; and
a liquid crystal element,
wherein a channel region of the transistor comprises an oxide semiconductor,
wherein light transmission of the liquid crystal element is selected depending on a signal input through the transistor,
wherein the light-blocking panel is provided in a direction in which light is emitted from the display panel, and
wherein each of the optical shutter regions is controlled independently whether light from the pixel regions is to be blocked by the liquid crystal element.

2. The display device according to claim 1, wherein a concentration of hydrogen in the oxide semiconductor is $5 \times 10^{19}/\text{cm}^3$ or lower.

3. The display device according to claim 1, wherein a carrier density of the oxide semiconductor is lower than $1 \times 10^{14}/\text{cm}^3$.

4. The display device according to claim 1, wherein a band gap of the oxide semiconductor is 2 eV or more.

5. The display device according to claim 1, wherein a value obtained by division of an off-state current by a channel width of the transistor is lower than or equal to 100 zA/μm.

6. The display device according to claim 1, wherein crystal parts comprised in the oxide semiconductor are aligned in a direction substantially perpendicular to a surface of the oxide semiconductor.

7. The display device according to claim 1, wherein a distance from one end to an opposing end of all the optical shutter regions is shorter than a distance from one end to an opposing end of all the pixel regions.

8. A display device comprising:
a display panel comprising pixel regions;
a light-blocking panel comprising optical shutter regions each comprising:
a transistor; and
a liquid crystal element; and
a sensor operationally connected to the light-blocking panel,
wherein a channel region of the transistor comprises an oxide semiconductor,
wherein light transmission of the liquid crystal element is selected depending on a signal input through the transistor,
wherein the light-blocking panel is provided in a direction in which light is emitted from the display panel, and
wherein each of the optical shutter regions is controlled independently whether light from the pixel regions is to be blocked by the liquid crystal element.

9. The display device according to claim 8, wherein a concentration of hydrogen in the oxide semiconductor is $5 \times 10^{19}/\text{cm}^3$ or lower.

10. The display device according to claim 8, wherein a carrier density of the oxide semiconductor is lower than $1 \times 10^{14}/\text{cm}^3$.

11. The display device according to claim 8, wherein a band gap of the oxide semiconductor is 2 eV or more.

12. The display device according to claim 8, wherein a value obtained by division of an off-state current by a channel width of the transistor is lower than or equal to 100 zA/μm.

13. The display device according to claim 8, wherein crystal parts comprised in the oxide semiconductor are aligned in a direction substantially perpendicular to a surface of the oxide semiconductor.

14. The display device according to claim 8, wherein a distance from one end to an opposing end of all the optical shutter regions is shorter than a distance from one end to an opposing end of all the pixel regions.

15. The display device according to claim 8, wherein the sensor is configured to detect a direction of a user's eyes.

16. The display device according to claim 15, wherein operation of the optical shutter regions is controlled in accordance with the direction of the user's eyes.

17. A display device comprising:
a display panel comprising pixel regions; and
a light-blocking panel comprising optical shutter regions each comprising:
a transistor; and
a liquid crystal element,
wherein a channel region of the transistor comprises an oxide semiconductor,
wherein one of a source and a drain of the transistor is electrically connected to a first electrode of the liquid crystal element,
wherein the light-blocking panel is provided in a direction in which light is emitted from the display panel, and
wherein each of the optical shutter regions is controlled independently whether light from the pixel regions is to be blocked by the liquid crystal element.

18. The display device according to claim 17, wherein a concentration of hydrogen in the oxide semiconductor is $5 \times 10^{19}/cm^3$ or lower.

19. The display device according to claim 17, wherein a carrier density of the oxide semiconductor is lower than $1 \times 10^{14}/cm^3$.

20. The display device according to claim 17, wherein a band gap of the oxide semiconductor is 2 eV or more.

21. The display device according to claim 17, wherein a value obtained by division of an off-state current by a channel width of the transistor is lower than or equal to 100 zA/μm.

22. The display device according to claim 17, wherein crystal parts comprised in the oxide semiconductor are aligned in a direction substantially perpendicular to a surface of the oxide semiconductor.

23. The display device according to claim 17, wherein a distance from one end to an opposing end of all the optical shutter regions is shorter than a distance from one end to an opposing end of all the pixel regions.

24. The display device according to claim 17,
wherein the optical shutter regions each comprises:
a capacitor electrically connected to the transistor and the liquid crystal element; and
a spacer overlapping with the first electrode and the capacitor.

25. The display device according to claim 17,
wherein the optical shutter regions each comprises:
a capacitor electrically connected to the transistor and the liquid crystal element, the capacitor comprising a second electrode and a first insulating layer;
a second insulating layer between the first electrode and the second electrode in a region between the transistor and the capacitor; and
a spacer overlapping with the first electrode, the second electrode, the first insulating layer, and the second insulating layer.

26. The display device according to claim 17,
wherein a part of a first conductive layer is capable of being the other of the source and the drain of the transistor,
wherein a part of a second conductive layer is capable of being a gate of the transistor,
wherein the first conductive layer and the second conductive layer overlap with each other in a first region and do not overlap with each other in a second region,
wherein a width of the first conductive layer in the first region is smaller than a width of the first conductive layer in the second region.

27. The display device according to claim 17,
wherein a part of a first conductive layer is capable of being the other of the source and the drain of the transistor,
wherein a part of a second conductive layer is capable of being a gate of the transistor,
wherein the first conductive layer and the second conductive layer overlap with each other in a first region and do not overlap with each other in a second region,
wherein a semiconductor layer is interposed between the first conductive layer and the second conductive layer in the first region.

* * * * *